United States Patent
Chae et al.

(10) Patent No.: US 11,665,446 B2
(45) Date of Patent: May 30, 2023

(54) IMAGE SENSING SYSTEM AND OPERATING METHOD THEREOF

(71) Applicant: SAMSUNG ELECTRONICS CO., LTD., Suwon-si (KR)

(72) Inventors: Heesung Chae, Seoul (KR); Yunhwan Jung, Hwaseong-si (KR); Kyung-Min Kim, Seoul (KR); Kyungtae Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/464,273

(22) Filed: Sep. 1, 2021

(65) Prior Publication Data

US 2022/0006966 A1    Jan. 6, 2022

Related U.S. Application Data

(63) Continuation of application No. 16/503,029, filed on Jul. 3, 2019, now Pat. No. 11,172,149.

(30) Foreign Application Priority Data

Oct. 2, 2018    (KR) .......................... 10-2018-0117675

(51) Int. Cl.
*H04N 25/616*    (2023.01)
*H03M 1/12*    (2006.01)
*H04N 25/70*    (2023.01)

(52) U.S. Cl.
CPC ........ *H04N 25/616* (2023.01); *H03M 1/1245* (2013.01); *H04N 25/70* (2023.01)

(58) Field of Classification Search
CPC ...... H04N 5/3575; H04N 5/369; H04N 5/347; H04N 5/378; H04N 5/357; H03M 1/1245; H03M 1/0636; H03M 1/56; H03M 1/123
(Continued)

(56) References Cited

U.S. PATENT DOCUMENTS 6,014,471 A * 1/2000 Barkan ..................... G06T 5/20
                                                                358/463
7,518,539 B2   4/2009 Han et al.
(Continued)

FOREIGN PATENT DOCUMENTS

KR    10-2006-0043071    5/2006
KR    1020080021849    3/2008
(Continued)

OTHER PUBLICATIONS

Notice of Allowance dated Jul. 9, 2021 in corresponding U.S. Appl. No. 16/503,029.

*Primary Examiner* — Lin Ye
*Assistant Examiner* — Chan T Nguyen
(74) *Attorney, Agent, or Firm* — F. Chau & Associates, LLC

(57) ABSTRACT

An image sensing system includes a pixel array, an analog-to-digital converter circuit, and an average calculator. The analog-to-digital converter circuit converts a first pixel signal to first pixel data and converts a second pixel signal to second pixel data. The average calculator generates a first average bit based on a first bit of the first pixel data and a first bit of the second pixel data during a first time and generates a second average bit based on a second bit of the first pixel data and a second bit of the second pixel data during a second time.

19 Claims, 13 Drawing Sheets

(58) Field of Classification Search
USPC .......................................................... 348/308
See application file for complete search history.

(56) References Cited

U.S. PATENT DOCUMENTS

| | | |
|---|---|---|
| 7,876,371 B2 | 1/2011 | Otaka |
| 9,661,251 B1 | 5/2017 | Eshel et al. |
| 9,712,772 B2 | 7/2017 | Kim et al. |
| 9,807,327 B2 | 10/2017 | Tate |
| 9,813,652 B2 | 11/2017 | Wong et al. |
| 9,942,505 B2 | 4/2018 | Nitta et al. |
| 2005/0195304 A1* | 9/2005 | Nitta ................... H03M 1/1023 348/E3.02 |
| 2018/0098015 A1 | 4/2018 | Lee et al. |
| 2020/0106974 A1 | 4/2020 | Chae et al. |

FOREIGN PATENT DOCUMENTS

| | | |
|---|---|---|
| KR | 1020090083817 | 8/2009 |
| KR | 1020150020432 | 2/2015 |
| KR | 10-1536649 | 7/2015 |

\* cited by examiner

IMAGE SENSING SYSTEM AND OPERATING METHOD THEREOF

CROSS-REFERENCE TO RELATED APPLICATIONS

This U.S. non-provisional application is a continuation of U.S. patent application Ser. No. 16/503,029 filed Jul. 3, 2019, which claims priority under 35 U.S.C. § 119 to Korean Patent Application No. 10-2018-0117675 filed on Oct. 2, 2018, in the Korean Intellectual Property Office, the disclosures of which are incorporated by reference in their entirety herein.

BACKGROUND

1. Technical Field

Embodiments of the inventive concept disclosed herein relate to image processing, and more particularly, relate to an image sensing system and an operating method thereof.

2. Discussion of Related Art

Various electronic devices such as a smartphone, a personal computer (PC), a digital camera, or a digital camcorder are equipped with an image sensor for obtaining and processing an image. The image sensor may include a charge coupled device (CCD) image sensor or a complementary metal-oxide-semiconductor (CMOS) image sensor (CIS). An image obtained from the image sensor may be processed by an image signal processor.

An image signal processor which can generate and process an image frame at high speed is currently required. However, the limits of the speed at which the image signal processor processes data and the amount of data which the image signal processor process make it difficult to implement an image frame at a high speed.

SUMMARY

At least one exemplary embodiment of the inventive concept provides an image sensing system which may improve the speed at which an image frame is generated and processed and may reduce a noise occurring in the process of converting a pixel signal from an analog signal to a digital signal and an operating method thereof.

According to an exemplary embodiment of the inventive concept, an image sensing system includes a pixel array that includes a first pixel generating a first pixel signal and a second pixel generating a second pixel signal, an analog-to-digital converter circuit that converts the first pixel signal to first pixel data and converts the second pixel signal to second pixel data, and an average calculator that generates a first average bit based on a first bit of the first pixel data and a first bit of the second pixel data during a first time and generates a second average bit based on a second bit of the first pixel data and a second bit of the second pixel data during a second time.

According to an exemplary embodiment of the inventive concept, an image sensing system includes a pixel array having a first pixel, and a second pixel having a same color as the first pixel, an analog-to-digital converter circuit configured to generate first pixel data based on a first pixel signal generated from the first pixel and to generate second pixel data based on a second pixel signal generated from the second pixel, and an average calculator configured to generate average data based on a sum operation applied to the first pixel data and the second pixel data, in response to a first enable signal and to output the first pixel data and the second pixel data in response to a second enable signal.

According to an exemplary embodiment of the inventive concept, an operating method of an image sensing system includes generating a first pixel signal, at a first pixel, generating a second pixel signal, at a second pixel having a same color as the first pixel, an analog-to-digital circuit converting the first and second pixel signals to first and second pixel data, an average calculator generating average data based on a sum operation applied to the first and second pixel data, and a data aligner outputting the average data serially received to an image signal processor in parallel.

According to an exemplary embodiment of the inventive concept, An image sensing system including a pixel array having a first pixel generating a first pixel signal and a second pixel generating a second pixel signal, an analog-to-digital converter circuit configured to convert the first pixel signal to first pixel data and to convert the second pixel signal to second pixel data, and a controller configured to average the first pixel data with the second pixel data to generate average data when the first pixel and the second pixel have a same color during a first operating mode. The controller outputs the average data to an image signal processor (ISP) during the first operating mode, and outputs the first pixel data and the second pixel data to the ISP during a second operating mode without generating the average data,

BRIEF DESCRIPTION OF THE FIGURES

The inventive concept will become apparent by describing in detail exemplary embodiments thereof with reference to the accompanying drawings.

DETAILED DESCRIPTION OF THE EXEMPLARY EMBODIMENTS

Below, embodiments of the inventive concept will be described clearly and in detail with reference to accompanying drawings to such an extent that one of ordinary skill in the art is capable of implementing embodiments of the invention.

Figure 1:
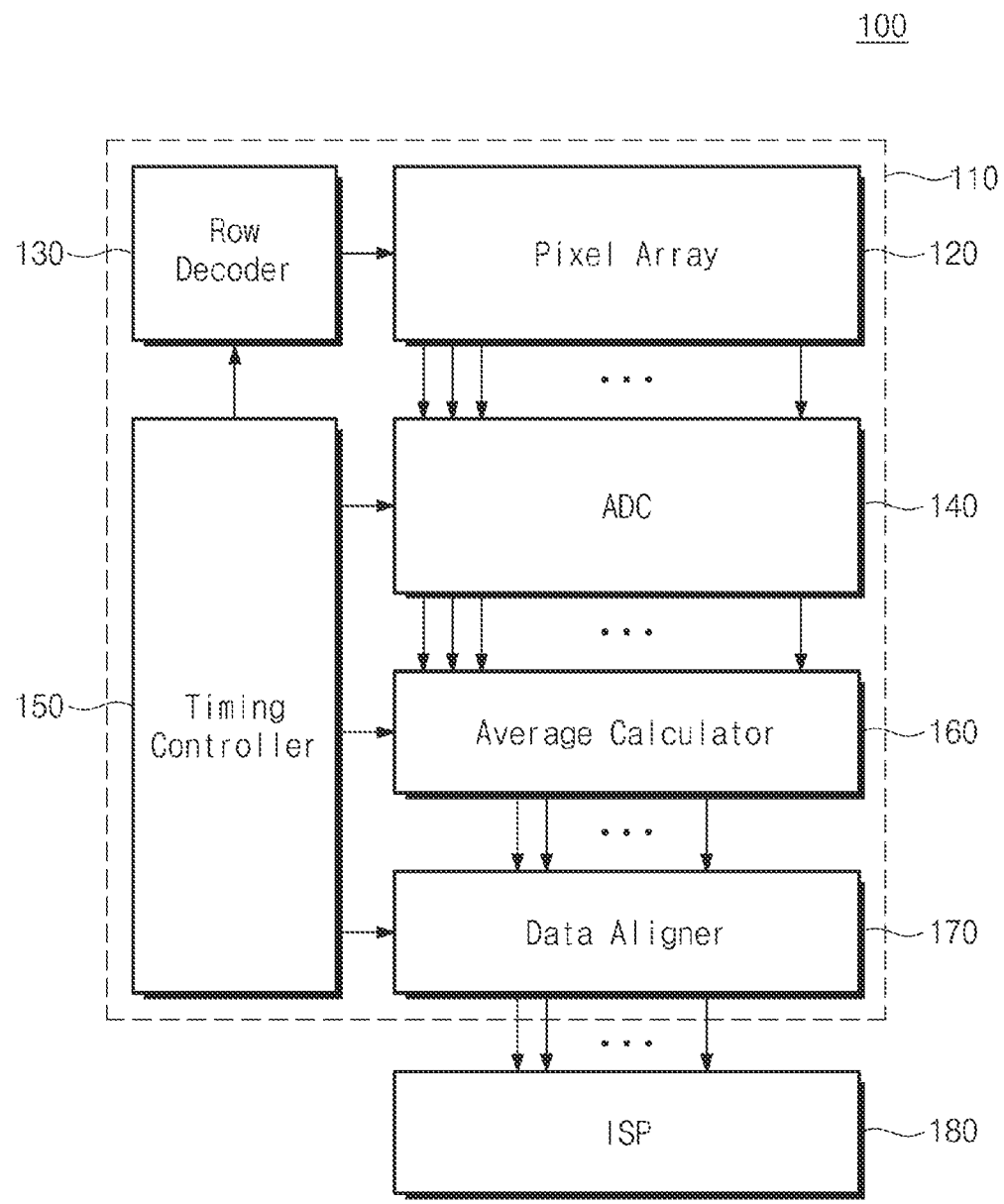
FIG. 1 is a block diagram of an image sensing system according to an exemplary embodiment of the inventive concept.

FIG. 1 is a block diagram of an image sensing system according to an exemplary embodiment of the inventive concept. Referring to FIG. 1, an image sensing system 100 includes an image sensor 110 and an image signal processor 180. The image sensing system 100 may be configured to obtain an image of the outside and to process and store the obtained image.

The image sensor 110 senses an external light. The external light may be a light that is reflected by a subject after being emitted from one or more light sources. In an embodiment, the image sensor 110 converts the sensed light to an image signal (e.g., an electrical signal) and generates an image frame from the image signal. For example, an image frame may include image data for all pixels of a display panel of a display device. In an embodiment, the image sensor 110 include a pixel array 120, a row decoder 130 (e.g., a decoding circuit), an analog-to-digital converter circuit 140, a timing controller 150 (e.g., a control circuit), an average calculator 160 (e.g., logic or a logic circuit to calculate an average value), and a data aligner 170 (e.g., logic or a logic circuit).

The pixel array 120 includes a plurality of pixels arranged two-dimensionally. Each of the plurality of pixels converts a light signal sensed from the outside to a pixel signal (e.g., an electrical signal). The pixel array 120 outputs the sensed pixel signals in response to driving signals. In an embodiment, the driving signals are applied by the row decoder 130. The pixel array 120 may provide the plurality of pixel signals sensed by the plurality of pixels to the analog-to-digital converter circuit 140 through a plurality of column lines. In an embodiment, the column lines are the vertical lines in FIG. 1 between the pixel array 120 and the analog-to-digital converter circuit 140.

The row decoder 130 may select a row of one or more pixels of the pixels included in the pixel array 120. At least a part of the pixels included in the selected row may provide the sensed pixel signal to the analog-to-digital converter circuit 140. To this end, the row decoder 130 may generate a row selection signal and may provide the row selection signal to the pixel array 120. The row decoder 130 may generate the row selection signal under control of the timing controller 150.

The analog-to-digital converter circuit 140 converts the pixel signal (e.g., an analog signal) output from the pixel array 120 to image data (e.g., a digital signal). In an exemplary embodiment, the analog-to-digital converter circuit 140 includes a correlated double sampler for performing digital sampling and for removing a fixed pattern noise (FPN). The analog-to-digital converter circuit 140 may further include a counter (e.g., a counter circuit) which counts a counter clock (e.g., a clock signal including pulses) to generate pixel data while a signal generated as a digital sampling result has a high level.

The analog-to-digital converter circuit 140 may generate pixel data for each column (e.g., column of pixels) under control of the timing controller 150. For example, the analog-to-digital converter circuit 140 may include a plurality of column analog-to-digital converters respectively corresponding to the plurality of column lines. Each of the plurality of column analog-to-digital converters may convert a pixel signal received from the corresponding column line to pixel data.

The analog-to-digital converter circuit 140 may output pixel data corresponding to the selected row in parallel. Compared to the case of outputting pixel data in series, upon outputting pixel data in parallel, noise immunity may be improved. Also, each of the plurality of column analog-to-digital converters may sequentially output pixel data for each bit. Compared to the case of simultaneously outputting a plurality of bits included in pixel data, upon sequentially outputting pixel data, the number of full adders for a sum operation of the average calculator 160 later may decrease.

The timing controller 150 may control overall operations of the image sensor 110. The timing controller 150 may provide control signals to the row decoder 130 and the analog-to-digital converter circuit 140 to drive the image sensor 110. Under control of the timing controller 150, the analog-to-digital converter circuit 140 may output pixel data to the average calculator 160. Under control of the timing controller 150, the average calculator 160 may generate average data by performing an average operation on the pixel data to generate average data, and the data aligner 170 may perform an alignment operation on the average data.

In an exemplary embodiment, the average calculator 160 merges pixel data corresponding to two or more pixels. For example, the average calculator 160 may calculate an average of pixel data values corresponding to two or more pixels. To this end, the average calculator 160 may include at least one full adder. A full adder may perform an average operation by performing a sum operation on first pixel data and second pixel data and performing bit shifting on a result of the sum operation. The average calculator 160 may output average data generated as a result of the average operation.

In an exemplary embodiment, the average calculator 160 merges pixel data corresponding to pixels of the same type, that is, the same color. Since the average operation is performed on pixel data corresponding to pixels of the same color, the amount of data to be output to the image signal processor 180 may decrease. For example, when pixel data corresponding to two pixels are merged, the amount of data to be output to the data aligner 170 and the image signal processor 180 may be halved. A noise may occur when a pixel signal is converted to pixel data through the analog-to-digital converter circuit 140. However, a noise which occurs when a particular pixel signal is converted to pixel data may be reduced by performing the average operation.

As the amount of data decreases, a data alignment burden of the data aligner 170 may decrease, and a processing speed of the image signal processor 180 may increase. Thus, the speed at which an image frame is processed may increase without increasing a clock speed associated with an operation of the image sensing system 100. Even though the number of pixels included in the pixel array 120 increases to improve the image quality, the number of channels for transferring data to the image signal processor 180 need not increase for stably processing an image frame. Accordingly, the size of a chip in which the image sensing system 100 is implemented need not increase, and power consumption for processing of an image frame may decrease.

The data aligner 170 may align the average data. For example, the average calculator 160 may sequentially output the average data for each bit. The data aligner 170 may first receive a first bit of first average data and a first bit of second average data and then may receive a second bit of the first average data and a second bit of the second average data. The data aligner 170 may output the first and second bits (first and second average bits) of the first average data in parallel and may output the first and second bits of the second average data in parallel. The data aligner 170 may include a buffer (not illustrated) for temporarily storing bits until all bits of average data are received. For example, if the first bit of the first average data is received at time 1, and the second bit of the first average data is received at time 2, the data aligner 170 may output the first bit of the first average data and the second bit of the first average data together at time 3.

The image signal processor 180 receives the aligned average data from the data aligner 170. The image signal processor 180 may perform various image processing operations based on the aligned average data. The image signal processor 180 may perform various operations for image processing. For example, the image signal processor 180 may perform image processing such that an image photographed by the image sensor 110 is displayed by a display device (not illustrated).

The image signal processor 180 may use average data, the amount of which is smaller than the amount of data input to the average calculator 160, thus processing an image quickly. For example, in the case of providing a preview of a photographed image or providing a video, fast image processing may be required. In this case, the image signal processor 180 may perform image processing at high speed. Since pixel data corresponding to pixels of the same color are merged, the degradation of the image quality may not be observed by a user.

The image sensing system 100 of FIG. 1 may be understood as an embodiment in which merging is performed on pixel data to generate a merged result and the merged result is output to the image signal processor 180, but the image sensing system 100 is not limited to the structure of FIG. 1. For example, the image signal processor 180 may be included in a separate application processor (not illustrated), not the image sensing system 100. The image sensing system 100 may include an image sensor interface device (not illustrated), and average data may be transferred through the image sensor interface device to the image signal processor 180 located outside the image sensing system 100.

Figure 2:
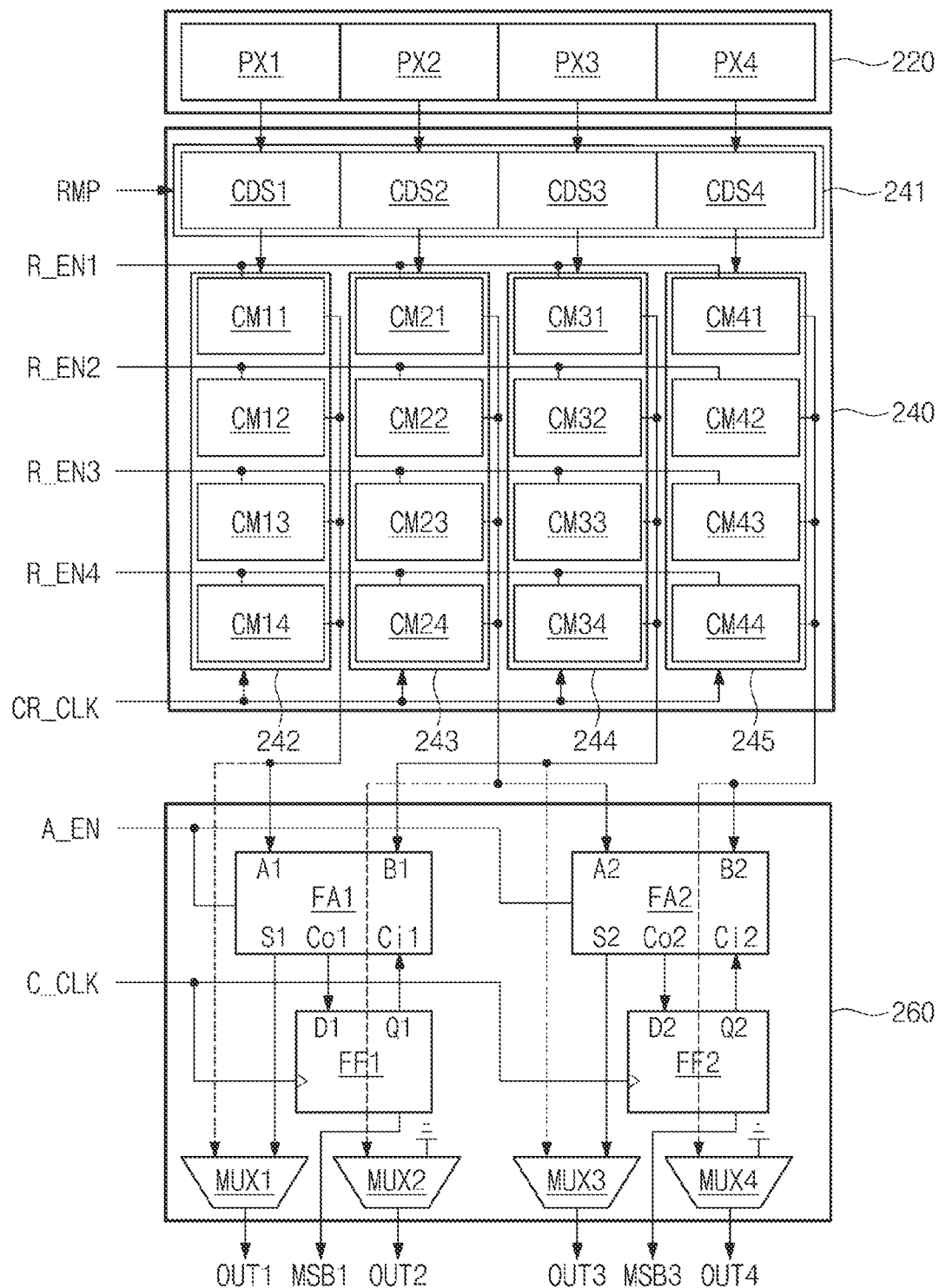
FIG. 2 is a diagram illustrating an exemplary embodiment of an image sensing system of FIG. 1.

FIG. 2 is a diagram illustrating an exemplary embodiment of an image sensing system of FIG. 1. Referring to FIG. 2, an image sensing system 200 includes a pixel array 220, an analog-to-digital converter circuit 240, and an average calculator 260 (e.g., a controller or a control circuit). The pixel array 220, the analog-to-digital converter circuit 240, and the average calculator 260 may correspond to the pixel array 120, the analog-to-digital converter circuit 140, and the average calculator 160 of FIG. 1, respectively. For convenience of description, a row decoder, a timing controller, a data aligner, and an image signal processor are omitted, but may be included in the image sensing system 200.

The pixel array 220 includes first to fourth pixels PX1 to PX4. For convenience of description, four pixels are illustrated, but the number of pixels included in the pixel array 220 is not limited thereto. The first to fourth pixels PX1 to PX4 may be arranged in a row direction. The first to fourth pixels PX1 to PX4 may sense an external light based on the same row selection signal. The first to fourth pixels PX1 to PX4 may output first to fourth pixel signals to the analog-to-digital converter circuit 240. In the example below, the first pixel PX1 and the third pixel PX3 are pixels of a same first color, and the second pixel PX2 and the fourth pixel PX4 are pixels of a same second color.

The analog-to-digital converter circuit 240 is configured to convert the first to fourth pixel signals to first to fourth pixel data. To this end, the analog-to-digital converter circuit 240 may include a correlated double sampling circuit 241 and first to fourth column counters 242 to 245 (e.g., counting circuits).

In an embodiment, the correlated double sampling circuit 241 compares a ramp signal RMP and pixel signals to generate comparison signals. The correlated double sampling circuit 241 includes first to fourth correlated double samplers CDS1 to CDS4. The first to fourth correlated double samplers CDS1 to CDS4 receive the first to fourth pixel signals, respectively. The first to fourth correlated double samplers CDS1 to CDS4 correspond to the first to fourth pixels PX1 to PX4, respectively. The first correlated double sampler CDS1 generates a first comparison signal based on a result of comparing the first pixel signal and the ramp signal RMP.

In an embodiment, the ramp signal RMP has a preset slope. In an embodiment, the ramp signal RMP is a signal having a voltage level which decreases with the preset slope. For example, while a voltage level of the first pixel signal is greater than a voltage level of the ramp signal RMP, the first comparison signal has a high level. As in the above description, the second to fourth correlated double samplers CDS2 to CDS4 may generate second to fourth comparison signals based on results of comparing the second to fourth pixel signals and the ramp signal RMP.

Although not illustrated in drawings, the ramp signal RMP may be generated by the timing controller 150 of FIG. 1 or by a separate ramp signal generator. In an embodiment, in the case where the separate ramp signal generator (not illustrated) is provided, under control of the timing controller 150, the ramp signal generator (not illustrated) generates the ramp signal RMP to provide the ramp signal to the correlated double sampling circuit 241.

The first to fourth column counters 242 to 245 generate the first to fourth pixel data, based on the first to fourth comparison signals received from the first to fourth correlated double samplers CDS1 to CDS4. The first to fourth pixel data correspond to the first to fourth pixels PX1 to PX4, respectively. The first column counter 242 includes first to fourth counter memories CM11 to CM14, the second column counter 243 includes first to fourth counter memories CM21 to CM24, the third column counter 243 includes first to fourth counter memories CM31 to CM34, and the fourth column counter 244 includes first to fourth counter memories CM41 to CM44. The first to fourth column counters 242 to 245 will be described with reference to the first column counter 242 and the first to fourth counter memories CM11 to CM14 included therein.

In an embodiment, while the first comparison signal generated from the first correlated double sampler CDS1 has a high level, the first column counter 242 counts a counter clock signal CR_CLK to generate the first pixel data. The higher the voltage level of the first pixel signal, the longer the time when the voltage level of the first pixel signal is higher than the voltage level of the ramp signal RMP. In this case, the time when the first comparison signal has the high level may become longer. This may mean that a time capable of counting the counter clock signal CR_CLK becomes longer. As the number of times that the counter clock signal CR_CLK is counted increases, the first pixel data generated may have a higher value. For example, the first pixel data could indicate an intensity level (grayscale) of the first pixel PX1, where the higher its value, the higher its intensity level.

Although not illustrated in drawings, the counter clock signal CR_CLK may be generated by the timing controller 150 of FIG. 1 or by a separate counter clock generator. In the case where the separate counter clock generator (not illustrated) is provided, under control of the timing controller 150, the counter clock generator (not illustrated) generates the counter clock CR_CLK and provides the counter clock signal CR_CLK to the first to fourth column counters 242 to 245.

During a first time, based on a first read enable signal R_EN1, a first bit of the first pixel data stored in the first counter memory CM11 is output. The first bit may be, but is not limited to, a least significant bit. During a second time following the first time, based on a second read enable signal R_EN2, a second bit of the first pixel data stored in the second counter memory CM12 is output. Likewise, during a third time following the second time, based on a third read enable signal R_EN3, a third bit of the first pixel data stored in the third counter memory CM13 is output. During a fourth time following the third time, based on a fourth read enable signal R_EN4, a fourth bit of the first pixel data stored in the fourth counter memory CM14 is output. However, the inventive concept is not limited thereto. For example, depending on timing settings of the first to fourth read enable signals R_EN1 to R_EN4, bits belonging to a bit group (e.g., the first and second bits of the first pixel data) including a plurality of bits may be output in parallel. In this case, depending on the number of bits to be output in parallel, the average calculator 260 may further include full adders.

In an embodiment, the first to fourth read enable signals R_EN1 to R_EN4 may be generated by the timing controller 150 of FIG. 1 or by a separate enable signal generator. In the case where the separate enable signal generator (not illustrated) is provided, under control of the timing controller 150, the enable signal generator (not illustrated) outputs the first to fourth read enable signals R_EN1 to R_EN4 to the first to fourth column counters 242 to 245 at the first to fourth times, respectively. In an embodiment, the first to fourth bits of the first pixel data are sequentially output to the average calculator 260.

In an embodiment, the average calculator 260 performs an average operation on the first to fourth pixel data generated by the analog-to-digital converter circuit 240. When the first pixel PX1 and the third pixel PX3 are pixels of the same color and the second pixel PX2 and the fourth pixel PX4 are pixels of the same color, the average calculator 260 merges (e.g., averages together) the first pixel data and the third pixel data and merges (e.g., averages together) the second pixel data and the fourth pixel data. To this end, the average calculator 260 may include first and second full adders FA1 and FA2, first and second flip-flops FF1 and FF2, and first to fourth multiplexers MUX1 to MUX4.

During a first operating mode when original data is required, the average calculator 260 does not perform this average operation. Thus, during the first operating mode, the average calculator 260 outputs first to fourth pixel data. However, during a second operating mode, the average calculator 260 performs the average operation, and thus the average calculator 260 instead outputs a first average of the first and third pixel data and a second average of the second and fourth pixel data. For example, if each pixel data is 8 bits, then 32 bits would be output during the first operating mode and 16 bits would be output during the second operating mode. For example, if the first pixel data of a first green pixel (PX1) is a grayscale of 100 and the third pixel data of second green pixel (PX3) is a grayscale of 200, second pixel data of a first red pixel (PX2) is a grayscale of 60 and fourth pixel data of second red pixel (PX2) is a grayscale of 80, then the average calculator 260 would output 4 grayscales of 100, 60, 200, and 80 during the first operating mode, but only output 2 grayscales of 150 (e.g., average of 100 and 200) and 70 (e.g., an average of 60 and 80) during the second operating mode.

The first and second full adders FA1 and FA2 may perform a sum operation based on an enable signal A_EN. In an embodiment, the enable signal A_EN is a signal for determining whether to perform the average operation. For example, in the case where the enable signal A_EN is at a high level (hereinafter referred to as a "first enable signal"), the average calculator 260 performs the average operation. For example, in the case where the enable signal A_EN is at a low level (hereinafter referred to as a "second enable signal"), the average calculator 260 outputs the first to fourth pixel data without a separate operation (e.g., without performing the average operation).

The enable signal A_EN may have a preset level depending on an image processing operation of the image signal processor 180 of FIG. 1. The enable signal A_EN may have a low level in a first operating mode and may have a high level in a second operating mode. For example, when the image signal processor 180 performs an operation which requires original data, the image sensing system 200 operates in the first operating mode. For example, when the image signal processor 180 performs a processing operation for previewing an image or a processing operation for displaying a video, the image sensing system 200 operates in the second operating mode. However, the inventive concept is not limited thereto. For example, a level of the enable signal A_EN may be set according to selection of a user.

In an embodiment, the enable signal A_EN may be generated by the timing controller 150 of FIG. 1 or by a separate enable signal generator. In the case where the separate enable signal generator (not illustrated) is provided, under control of the timing controller 150, the enable signal generator (not illustrated) outputs the enable signal A_EN depending on an operating mode and outputs the enable signal A_EN to the first and second full adders FA1 and FA2.

In an embodiment, the first full adder FA1 performs a sum operation on the first pixel data and the third pixel data. A particular bit of the first pixel data is input to a first input terminal A1 of the first full adder FA1, and a particular bit of the third pixel data is input to a second input terminal B1 thereof. A carry bit which is generated based on a sum operation on bits before the particular bits of the first and third pixel data, is input to a third input terminal Ci1 of the first full adder FA1. Based on the sum operation on bits respectively input to the first, second, and third input terminals A1, B1, and Ci1, a sum bit is output from a first output terminal S1, and a carry bit is output from a second output terminal Co1.

Likewise, the second full adder FA2 may perform a sum operation on the second pixel data and the fourth pixel data. Based on a sum operation on bits respectively input to first, second, and third input terminals A2, B2, and Ci2 of the second full adder FA2, a sum bit is output from a first output terminal S2, and a carry bit is output from a second output terminal Co2.

The first and second flip-flops FF1 and FF2 may output received carry bits to the first and second full adders FA1 and FA2 based on a carry clock signal C_CLK. While the first and second flip-flops FF1 and FF2 are illustrated as a D-type flip-flop, the inventive concept is not limited thereto. For example, the first and second flip-flops FF1 and FF2 may be replaced with a logic circuit that outputs a carry bit generated in a previous sum operation phase to a next sum operation phase.

In an embodiment, the carry clock signal C_CLK may be generated by the timing controller 150 of FIG. 1 or by a separate carry clock generator. In the case where the separate carry clock generator (not illustrated) is provided, under control of the timing controller 150, the carry clock generator (not illustrated) outputs the carry clock signal C_CLK to the first and second flip-flops FF1 and FF2. Since the first and second flip-flops FF1 and FF2 perform substantially the same operation, for convenience of description, the first flip-flop FF1 will be exemplified.

In a sum operation associated with the first bits of the first and third pixel data, the first flip-flop FF1 may output a bit value of "0" to the third input terminal Ci1 of the first full adder FA1. A first carry bit generated as a result of the sum operation associated with the first bits is provided to the first flip-flop FF1. When the carry clock signal C_CLK has a high level, the first flip-flop FF1 outputs the first carry bit to the first full adder FA1. The first full adder FA1 performs a sum operation on the second bits of the first and third pixel data and the first carry bit. In the case where a sum operation is performed on last bits (e.g., most significant bits) of the first and third pixel data, the last carry bit is provided to the first flip-flop FF1, and the first flip-flop FF1 outputs the last carry bit to the outside (e.g., the data aligner 170 of FIG. 1).

The first to fourth multiplexers MUX1 to MUX4 may determine bits output from the average calculator 260. The first multiplexer MUX1 outputs the first pixel data in the first operating mode and outputs a sum bit generated by the first full adder FA1 in the second operating mode. The second multiplexer MUX2 outputs the second pixel data in the first operating mode and does not output data in the second operating mode. The third multiplexer MUX3 outputs the third pixel data in the first operating mode and outputs a sum bit generated by the second full adder FA2 in the second operating mode. The fourth multiplexer MUX4 outputs the fourth pixel data in the first operating mode and does not output data in the second operating mode. In an embodiment, the first to fourth multiplexers MUX1 to MUX4 may determine bits to be output, based on the enable signal A_EN.

The average calculator 260 may output first average data based on the sum operation of the first pixel data and the third pixel data and may output second average data based on the sum operation of the second pixel data and the fourth pixel data. The average calculator 260 may output the sum bits output from the first full adder FA1 as bits of the first average data. The average calculator 260 may output the carry bit, which the first flip-flop FF1 lastly receives, as a most significant bit of the first average data. In this case, the average calculator 260 may output the first and second average data through a bit shifting operation, for the purpose of performing a division operation for an average.

Figure 3:
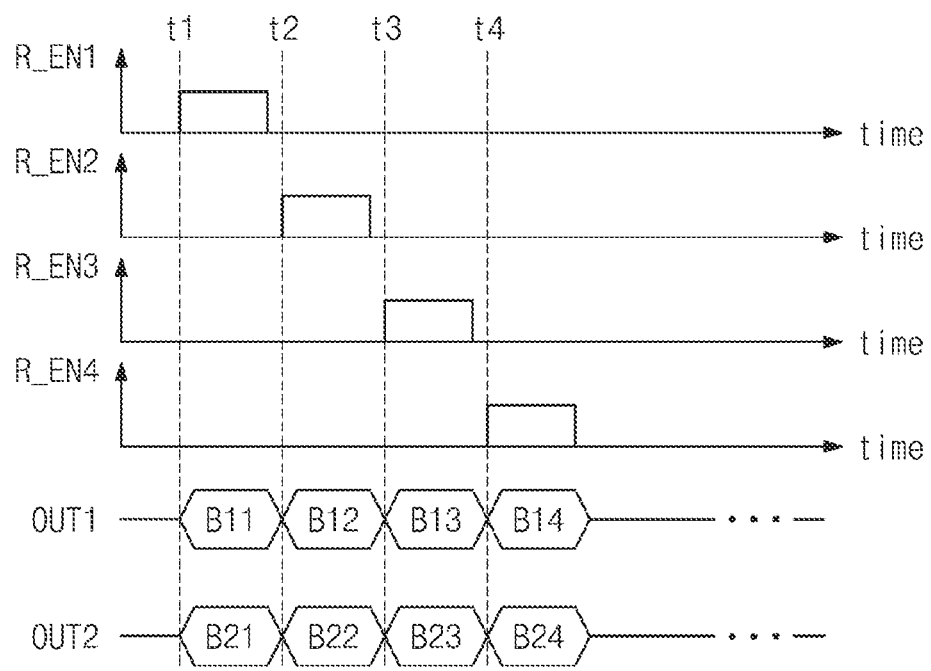
FIG. 3 is a timing diagram for describing data output from an analog-to-digital converter circuit or an average calculator, in a first operating mode of FIG. 2.

FIG. 3 is a timing diagram for describing data output from an analog-to-digital converter circuit (e.g., 140) or an average calculator (e.g., 160), in a first operating mode of FIG. 2. The first operating mode is used to output pixel data immediately without merging the pixel data. The first to fourth read enable signals R_EN1 to R_EN4 and output data OUT1 and OUT2 of the first and second multiplexers MUX1 and MUX2 over time are illustrated in FIG. 3. For convenience of description, output data OUT3 and OUT4 of the third and fourth multiplexers MUX3 and MUX4 are omitted. FIG. 3 will be described with reference to reference numerals/marks of FIG. 2.

After a first time point t1, the first read enable signal R_EN1 has a high level. In this case, the first counter memories CM11, CM21, CM31, and CM41 of the first to fourth column counters 242 to 245 outputs data stored therein. The first counter memory CM11 of the first column counter 242 outputs a first bit B11 of first pixel data. The first counter memory CM21 of the second column counter 243 outputs a first bit B21 of second pixel data. The average calculator 260 outputs the first bit B11 of the first pixel data and the first bit B21 of the second pixel data without performing a separate merging operation.

After a second time point t2, the second read enable signal R_EN2 has a high level. In this case, the second counter memories CM12, CM22, CM32, and CM42 of the first to fourth column counters 242 to 245 output data stored therein. A second bit B12 of the first pixel data is output from the second counter memory CM12 of the first column counter 242, and a second bit B22 of the second pixel data is output from the second counter memory CM22 of the second column counter 243. The third read enable signal R_EN3 has a high level after a third time point t3, and the fourth read enable signal R_EN4 has a high level after a fourth time point t4. In this case, a third bit B13 and a fourth bit B14 of the first pixel data are sequentially output, and a third bit B23 and a fourth bit B24 of the second pixel data are sequentially output.

In the first operating mode, the analog-to-digital converter circuit 240 or the average calculator 260 output the first to fourth pixel data respectively corresponding to the first to fourth pixels PX1 to PX4 in parallel. Also, the analog-to-digital converter circuit 240 or the average calculator 260 may sequentially output the first to fourth pixel data for each bit.

Figure 4:
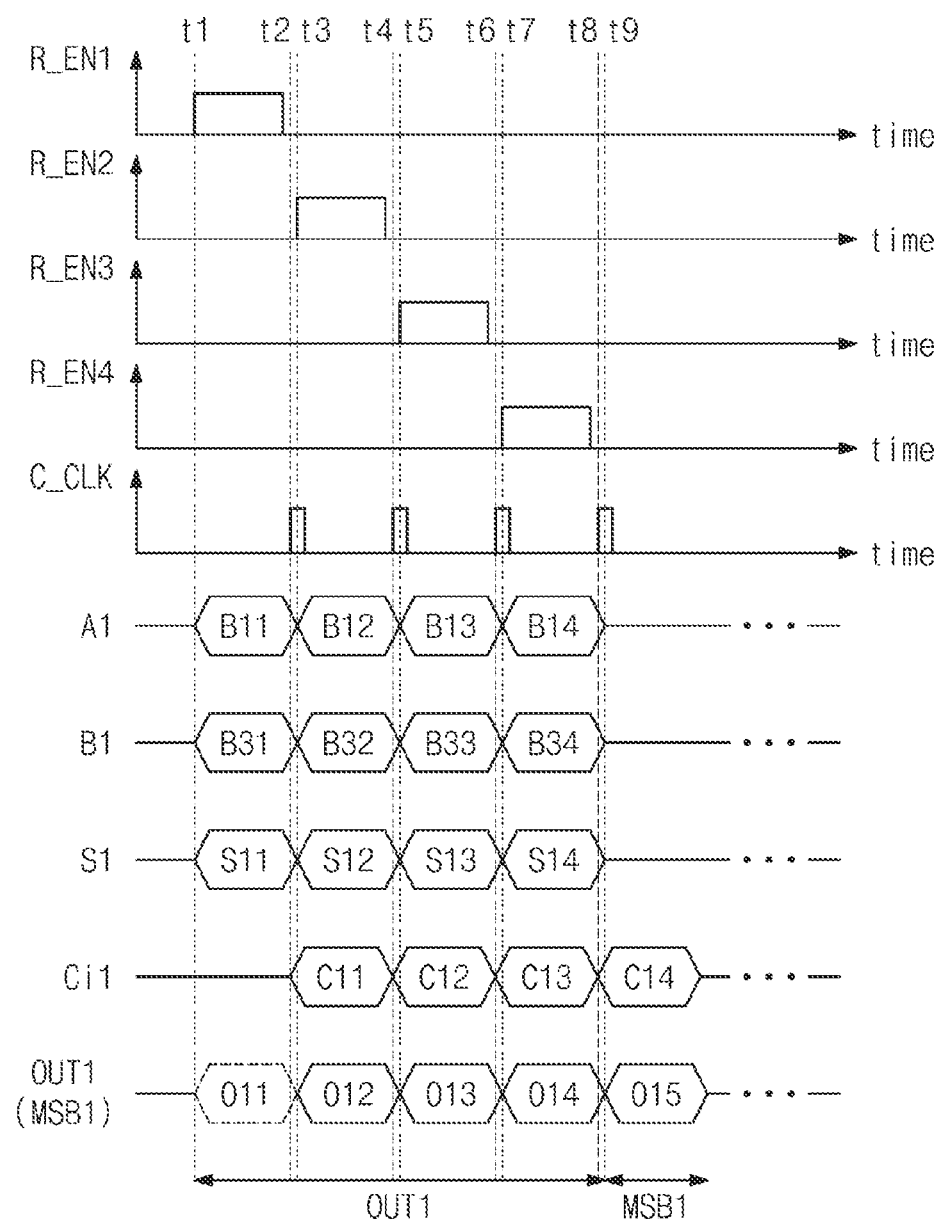
FIG. 4 is a timing diagram for describing data output from an average calculator, in a second operating mode of FIG. 2.

FIG. 4 is a timing diagram for describing data output from an average calculator, in a second operating mode of FIG. 2. The second operating mode is used to reduce the amount of data output by merging pixel data. The first to fourth read enable signals R_EN1 to R_EN4, the carry clock signal C_CLK, input/output bits of the first full adder FA1, and bits of average data over time are illustrated in FIG. 4. For convenience of description, the case where the first pixel data and the third pixel data of FIG. 2 are merged will be described, and the case where the second pixel data and the fourth pixel data of FIG. 2 are merged will be omitted. FIG. 4 will be described with reference to reference numerals/marks of FIG. 2.

After a first time point t1, the first read enable signal R_EN1 has a high level. In this case, the analog-to-digital converter circuit 240 outputs the first bit B11 of the first pixel data to the first input terminal A1 of the first full adder FA1 and outputs a first bit B31 of the third pixel data to the second input terminal B1 of the first full adder FA1. The first full adder FA1 generates a first sum bit S11 and a first carry bit C11 by performing a sum operation on the first bits B11 and B31 of the first and third pixel data.

In an embodiment, the first sum bit S11 is not included in average data by bit shifting. However, the inventive concept is not limited thereto. For example, the first sum bit S11 may be a first bit O11 of the average data in the case of considering a decimal point for an exact operation later. The first carry bit C11 is provided to the first flip-flop FF1. After the second time point t2, the carry clock signal C_CLK has a high level, and the first carry bit C11 provided to the first flip-flop FF1 is provided to the third input terminal Ci1 of the first full adder FA1.

After a third time point t3, the second read enable signal R_EN2 has a high level. In this case, the analog-to-digital converter circuit 240 outputs the second bit B12 of the first pixel data to the first input terminal A1 of the first full adder FA1 and outputs a second bit B32 of the third pixel data to the second input terminal B1 of the first full adder FA1. The first full adder FA1 generates a second sum bit S12 and a second carry bit C12 by performing a sum operation on the second bits B12 and B32 of the first and third pixel data and the first carry signal C11.

The second sum bit S12 may be a first bit O12 of the average data due to bit shifting in substitution for a division operation. In this case, the second sum bit S12 may be a least significant bit of the average data. The second carry bit C12 is provided to the first flip-flop FF1. After a fourth time point t4, the carry clock signal C_CLK has a high level, and the second carry bit C12 provided to the first flip-flop FF1 is provided to the third input terminal Ci1 of the first full adder FA1.

After a fifth time point t5, the third read enable signal R_EN3 has a high level. In this case, the analog-to-digital converter circuit 240 outputs the third bit B13 of the first pixel data to the first input terminal A1 of the first full adder FA1 and outputs a third bit B33 of the third pixel data to the second input terminal B1 of the first full adder FA1. The first full adder FA1 generates a third sum bit S13 and a third carry bit C13 by performing a sum operation on the third bits B13 and B33 of the first and third pixel data and the second carry signal C12. The third sum bit S13 may be a second bit O13 of the average data. After a sixth time point t6, the third carry bit C13 is provided to the third input terminal Ci1 of the first full adder FA1.

After a seventh time point t7, the fourth read enable signal R_EN4 has a high level. In this case, the analog-to-digital converter circuit 240 outputs the fourth bit B14 of the first pixel data to the first input terminal A1 of the first full adder FA1 and outputs a fourth bit B34 of the third pixel data to the second input terminal B1 of the first full adder FA1. The first full adder FA1 generates a fourth sum bit S14 and a fourth carry bit C14 by performing a sum operation on the fourth bits B14 and B34 of the first and third pixel data and the third carry signal C13.

The fourth sum bit S14 may be a third bit O14 of the average data. In the case where pixel data are 4-bit data, the fourth carry bit C14 may be a fourth bit O15 of the average data. In this case, the fourth carry bit C14 may be a most significant bit of the average data. After an eighth time point t8, the fourth carry bit C14 is provided to the third input terminal Ci1 of the first full adder FA1. After a ninth time point t9, bits may not be provided to the first and second input terminals A1 and B1 of the first full adder FA1, and thus, the fourth carry bit C14 may be output as the most significant bit of the average data.

Figure 5:
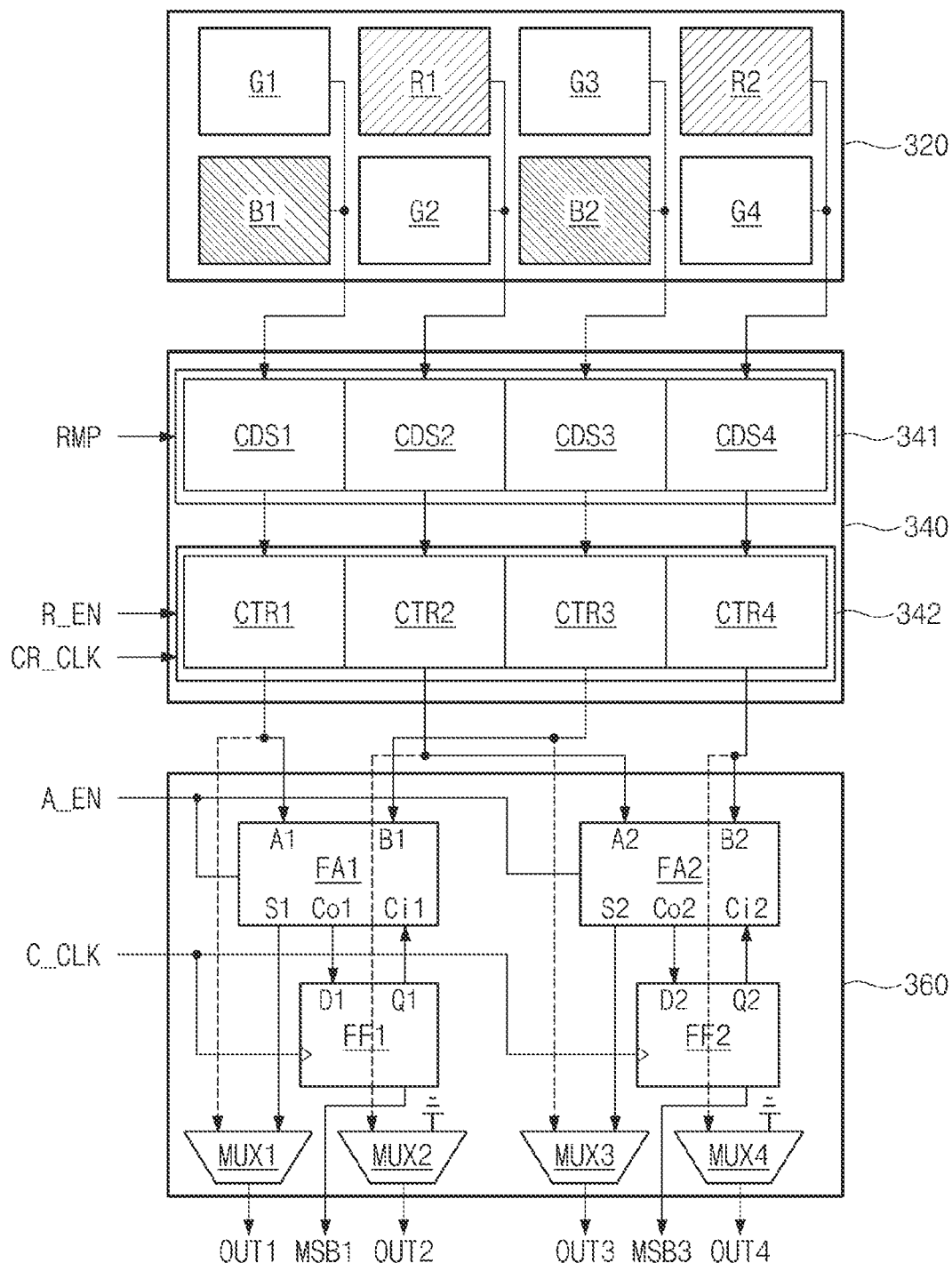
FIG. 5 is a diagram illustrating an exemplary embodiment of an image sensing system of FIG. 1.

FIG. 5 is a diagram illustrating an exemplary embodiment of an image sensing system of FIG. 1. Referring to FIG. 5, an image sensing system 300 includes a pixel array 320, an analog-to-digital converter circuit 340, and an average calculator 360. The pixel array 320, the analog-to-digital converter circuit 340, and the average calculator 360 may correspond to the pixel array 120, the analog-to-digital converter circuit 140, and the average calculator 160 of FIG. 1, respectively. For convenience of description, a row decoder, a timing controller, a data aligner, and an image signal processor are omitted, but may be included in the image sensing system 300.

The pixel array 320 may include first to fourth green pixels G1 to G4, first and second red pixels R1 and R2, and first and second blue pixels B1 and B2. Pixels included in the pixel array 320 may be arranged in the form of a Bayer pattern. The first green pixel G1, the first red pixel R1, the third green pixel G3, and the second red pixel R2 may be arranged in the order in a first row of the pixel array 320. The first blue pixel B1, the second green pixel G2, the second blue pixel B2, and the fourth green pixel G4 may be arranged in the order in a second row of the pixel array 320.

The analog-to-digital converter circuit 340 is configured to convert pixel signals generated from pixels included in the pixel array 320 to pixel data. To this end, the analog-to-digital converter circuit 340 may include a correlated double sampling circuit 341 and a counter circuit 342. The correlated double sampling circuit 341 may include the first to fourth correlated double samplers CDS1 to CDS4, which correspond to the first to fourth correlated double samplers CDS1 to CDS4 of FIG. 2, respectively. The counter circuit 342 may include first to fourth column counters CTR1 to CTR4, which correspond to the first to fourth column counters 242 to 245 of FIG. 2, respectively.

In an embodiment, a first output line is connected to the first column counter 242 and a first input (A1) of the first full adder FA1 to provide first pixel data of the first pixel PX1, a second output line is connected to the third column counter 244 and a second input (B1) of the first full adder FA2 to provide third pixel data of the third pixel PX3 when the first and third pixels PX1 and PX3 are a same first color, and a third output line is located between the first and second output lines and connected to the second column counter 243 and an input (A2) of the second full adder FA2 to provide second pixel data of the second pixel PX2 when the second pixel PX2 is a second color different from the first color.

First, the analog-to-digital converter circuit 340 converts pixel signals generated from pixels belonging to the first row to pixel data. The analog-to-digital converter circuit 340 may output first green pixel data, first red pixel data, third green pixel data, and second red pixel data, which respectively correspond to the first green pixel G1, the first red pixel R1, the third green pixel G3, and the second red pixel R2, to the average calculator 360 in parallel. The analog-to-digital converter circuit 340 may sequentially output the pixel data for each bit.

Next, the analog-to-digital converter circuit 340 converts pixel signals generated from pixels belonging to the second row to pixel data. The analog-to-digital converter circuit 340 may output first blue pixel data, second green pixel data, second blue pixel data, and fourth green pixel data, which respectively correspond to the first blue pixel B1, the second green pixel G2, the second blue pixel B2, and the fourth green pixel G4, to the average calculator 360 in parallel.

In an embodiment, the average calculator 360 performs an average operation on the pixel data output from the analog-to-digital converter circuit 340 in response to the enable signal A_EN. In an embodiment, the average calculator 360 performs the average operation on the generated pixel data based on pixels of the same color belonging to the same row. In the Bayer pattern illustrated in FIG. 5, the average calculator 360 performs the average operation on the first green pixel data and the third green pixel data and performs the average operation on the first red pixel data and the second red pixel data. Afterwards, the average calculator 360 performs the average operation on the first blue pixel data and the second blue pixel data and performs the average operation on the second green pixel data and the fourth green pixel data. As a result, pixel data corresponding to two unit pixels distinguished with respect to the Bayer pattern are merged into average data, the amount of which is reduced to half the amount of the pixel data corresponding to the two unit pixels.

As described with reference to FIGS. 2 to 4, the average calculator 360 may merge pixel data for each bit. For example, the average calculator 360 may perform the sum operation on a first bit of the first green pixel data and a first bit of the third green pixel data and may perform the sum operation on a second bit of the first green pixel data and a second bit of the third green pixel data. To this end, the average calculator 360 may include the first and second full adders FA1 and FA2, the first and second flip-flops FF1 and FF2, and the first to fourth multiplexers MUX1 to MUX4. The components included in the average calculator 360 are substantially identical to those of the average calculator 260 of FIG. 2, and thus, additional description will be omitted to avoid redundancy.

Figure 6:
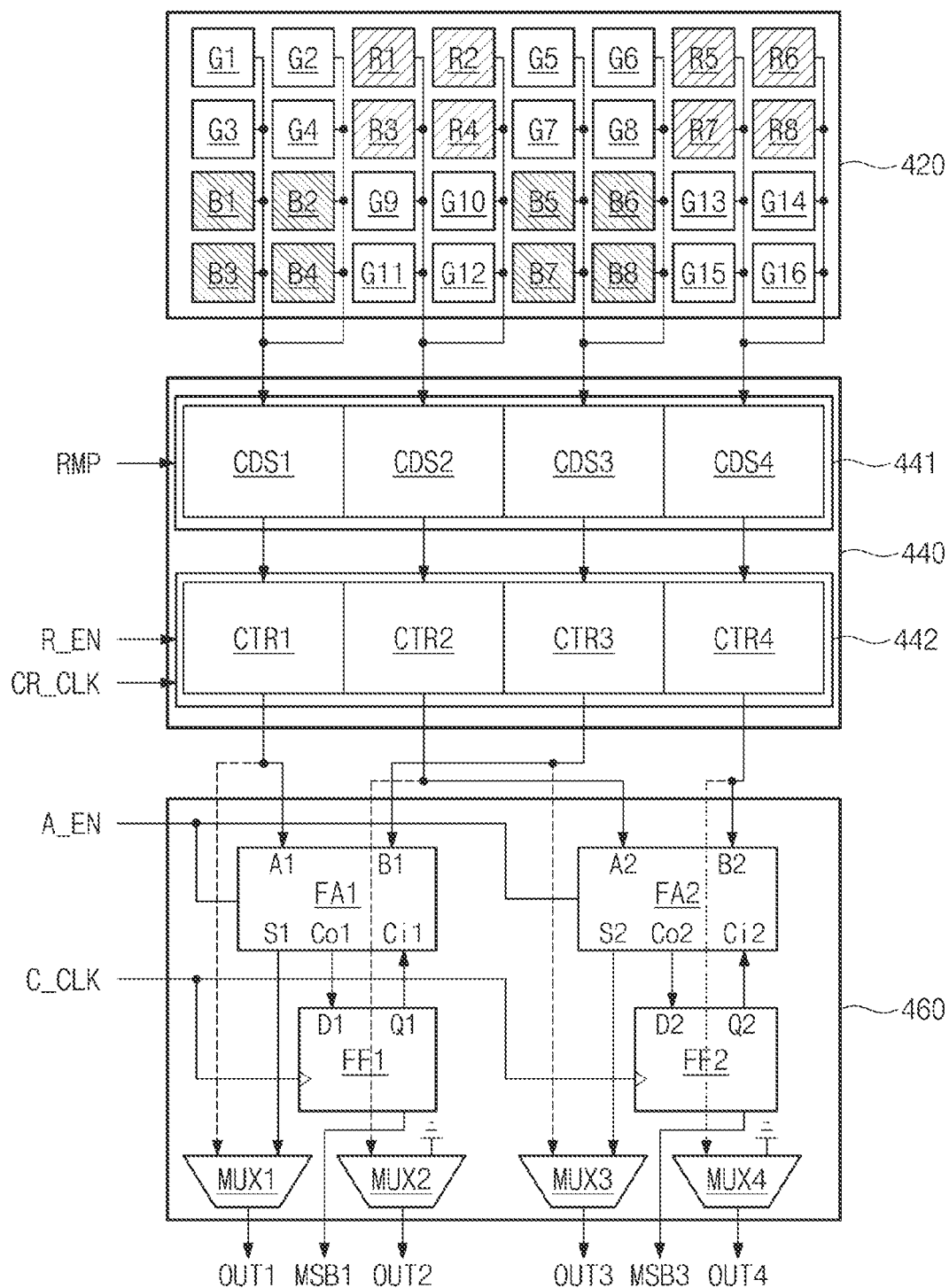
FIG. 6 is a diagram illustrating an exemplary embodiment of an image sensing system of FIG. 1.

FIG. 6 is a diagram illustrating an exemplary embodiment of an image sensing system of FIG. 1. Referring to FIG. 6, an image sensing system 400 includes a pixel array 420, an analog-to-digital converter circuit 440, and an average calculator 460. The pixel array 420, the analog-to-digital converter circuit 440, and the average calculator 460 may correspond to the pixel array 120, the analog-to-digital converter circuit 140, and the average calculator 160 of FIG. 1, respectively. For convenience of description, a row decoder, a timing controller, a data aligner, and an image signal processor are omitted, but may be included in the image sensing system 400.

The pixel array 420 includes first to sixteenth green pixels G1 to G16, first to eighth red pixels R1 to R8, and first to eighth blue pixels B1 to B8. In the pixel array 420, pixels of the same color, which form a 2-by-2 matrix, are arranged to be adjacent to each other. For example, the first to fourth green pixels G1 to G4 are positioned to be adjacent to each other. In the embodiment of FIG. 6, the pixel array 420 may operate under an operating environment classified as a low-illuminance environment or a high-illuminance environment.

In an exemplary embodiment, to ensure that images in the high-illuminance environment are clear, all pixels included in the pixel array 420 generate pixel signals. In this case, the analog-to-digital converter circuit 440 converts the pixel signals to pixel data, and the average calculator 460 merges the pixel data to generate average data. Although not illustrated in drawings, a data aligner or an image signal processor included in the image sensing system 400 may align the average data for the purpose of having an effect similar to the Bayer pattern. For example, the average data may be aligned to have the order of the first green pixel G1, the first red pixel R1, the second green pixel G2, and the second red pixel R2 in a row direction.

In an exemplary embodiment, to secure sensitivity and brightness of an image in the low-illuminance environment, pixel signals generated from 2-by-2 pixels adjacent to each other among the pixels included in the pixel array 420 are summed up before being provided to the analog-to-digital converter circuit 440. For example, the analog-to-digital converter circuit 440 may receive one summed signal instead of the first to fourth pixel signals generated from the first to fourth green pixels G1 to G4. FIG. 6 illustrates the case where pixel signals generated from two pixels adjacent in a row direction are summed up, for the purpose of describing an output of pixel signals in the low-illuminance environment.

The analog-to-digital converter circuit 440 is configured to convert pixel signals generated from pixels included in the pixel array 420 to pixel data. To this end, the analog-to-digital converter circuit 440 may include a correlated double sampling circuit 441 and a counter circuit 442, which correspond to the components described with reference to FIG. 2 or 5.

In an embodiment, the average calculator 460 performs an average operation on the pixel data output from the analog-to-digital converter circuit 440 in response to the enable signal A_EN. The average calculator 460 may include the first and second full adders FA1 and FA2, the first and second flip-flops FF1 and FF2, and the first to fourth multiplexers MUX1 to MUX4, which correspond to the components described with reference to FIG. 2 or 5.

In an embodiment, the average calculator 460 performs the average operation on the generated pixel data based on pixels of the same color belonging to the same row. For example, the average calculator 460 may perform the average operation on first and second green pixel data corresponding to the first and second green pixels G1 and G2. In this case, unlike the illustration of FIG. 6, a correlated double sampler to which the first green pixel signal is provided and a correlated double sampler to which the second green pixel signal is provided are different from each other.

In an embodiment, the average calculator 460 performs the average operation on first and fifth green pixel data corresponding to the first and fifth green pixels G1 and G5. In another embodiment, the average calculator 460 performs the average operation on four green pixel data corresponding to the first, second, fifth, and sixth green pixels G1, G2, G5, and G6. This average operation will be described with reference to FIG. 7 which illustrates an embodiment in which three or more pixel data are merged.

In an embodiment, the average calculator 460 performs the average operation on pixel data corresponding to at least two pixels of the first to fourth green pixels G1 to G4. For example, the average calculator 460 may perform the average operation on the first and third green pixel data corresponding to the first and third green pixels G1 and G3. In this case, after first green pixel data is generated, third green pixel data may be generated.

The image sensing system 400 may further include a buffer (not illustrated) for temporarily storing the first green pixel data (e.g., from G1) until the third green pixel data (e.g., from G3) is generated. In an embodiment, the buffer (not illustrated) is connected to an output terminal of the analog-to-digital converter circuit 440 and an input terminal of the average calculator 460. The buffer (not illustrated) may output pixel data stored therein for each bit, like the analog-to-digital converter circuit 440. The average calculator 460 may receive a first bit of the third green pixel data from the analog-to-digital converter circuit 440 and may simultaneously receive a first bit of the first green pixel data from the buffer (not illustrated).

By using the buffer (not illustrated), both an average operation associated with two pixels adjacent in a column direction and an average operation associated with pixel data corresponding to all the first to fourth green pixels G1 to G4 may be performed. In addition, an average operation associated with first to eighth green pixel data corresponding to the first to eighth green pixels G1 to G8 may be performed. Also, as described above, the first to fourth green pixel signals may be summed up in advance in the low-illuminance environment. The image sensing system 400 may convert a result of summing the first to fourth green pixel signals and a result of summing the fifth to eighth green pixel signals to digital signals, respectively, and may perform an average operation.

Figure 7:
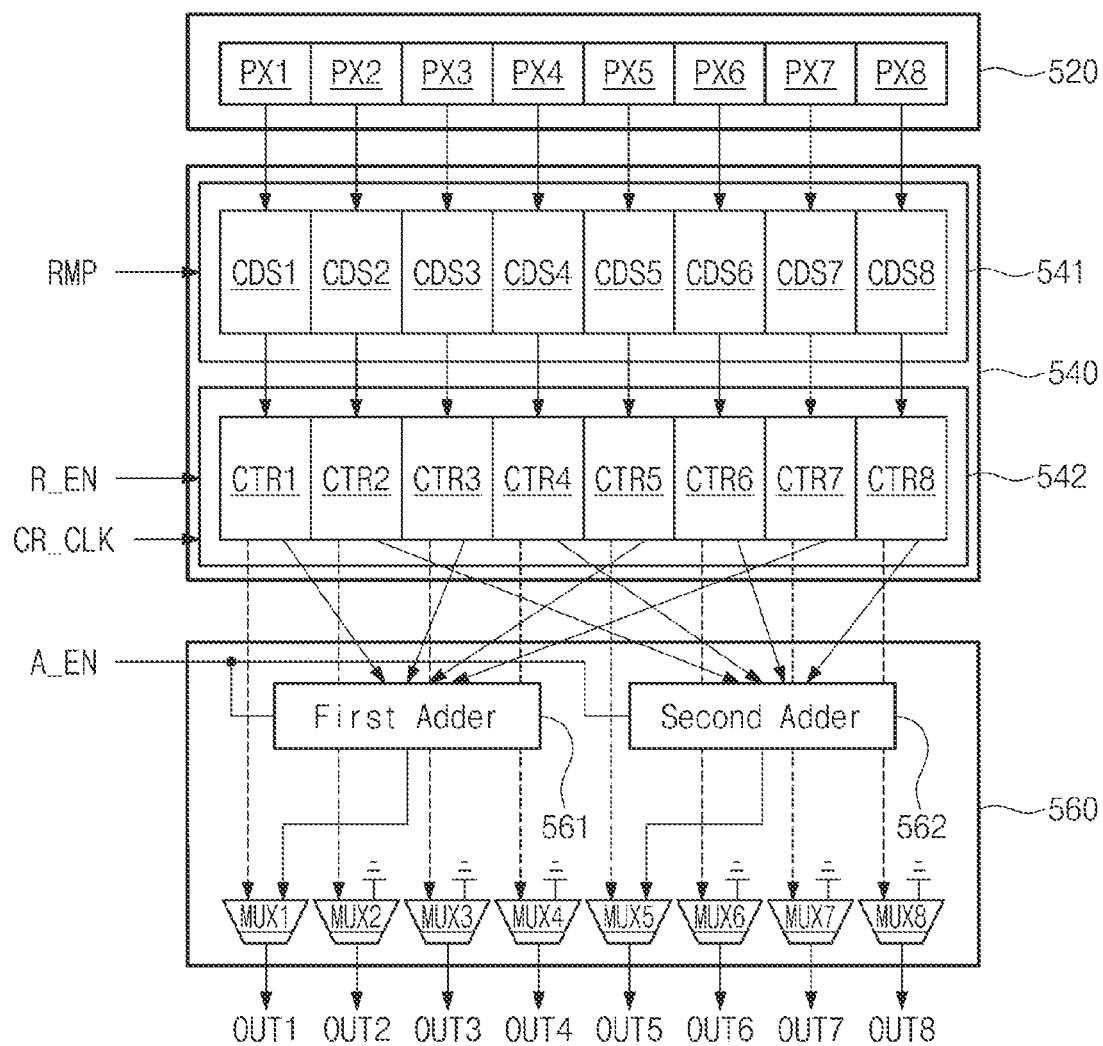
FIG. 7 is a diagram illustrating an exemplary embodiment of an image sensing system of FIG. 1.

FIG. 7 is a diagram illustrating an exemplary embodiment of an image sensing system of FIG. 1. Referring to FIG. 7, an image sensing system 500 includes a pixel array 520, an analog-to-digital converter circuit 540, and an average calculator 560. The pixel array 520, the analog-to-digital converter circuit 540, and the average calculator 560 may correspond to the pixel array 120, the analog-to-digital converter circuit 140, and the average calculator 160 of FIG. 1, respectively. For convenience of description, a row decoder, a timing controller, a data aligner, and an image signal processor are omitted, but may be included in the image sensing system 500.

The pixel array 520 includes first to eighth pixels PX1 to PX8. The analog-to-digital converter circuit 540 includes a correlated double sampling circuit 541 including first to eighth correlated double samplers CDS1 to CDS8, and a counter circuit 542 including first to eighth column counters CTR1 to CTR8. The first to eighth pixels PX1 to PX8 generate first to eighth pixel signals. The first to eighth correlated double samplers CDS1 to CDS8 generate first to eighth comparison signals based on results of comparing the first to eighth pixel signals and the ramp signal RMP. The first to eighth column counters CTR1 to CTR8 generate first to eighth pixel data based on the first to eighth comparison signals.

In an embodiment, the average calculator 560 performs an average operation on pixel data corresponding to three or more pixels. To this end, the average calculator 560 includes first and second adders 561 and 562 and first to eighth multiplexers MUX1 to MUX8. In an embodiment, the first adder 561 merges first, third, fifth, and seventh pixel data, and the second adder 562 merges second, fourth, sixth, and eighth pixel data. In this case, the first, third, fifth, and seventh pixels PX1, PX3, PX5, and PX7 are pixels of the same color, and the second, fourth, sixth, and eighth pixels PX2, PX4, PX6, and PX8 are pixels of the same color.

In an embodiment, when activated by the enable signal A_EN, the first and second adders 561 and 562 perform a sum operation on pixel data corresponding to three or more pixels. The average calculator 560 generates average data based on results of the sum operations. In the case of performing the average operation on four pixel data as illustrated in FIG. 7, bit shifting may be performed on output bits as much as 2 bits. However, the inventive concept is not limited thereto. For example, the average calculator 560 may perform a separate division operation instead of the bit shifting operation.

Figure 8:
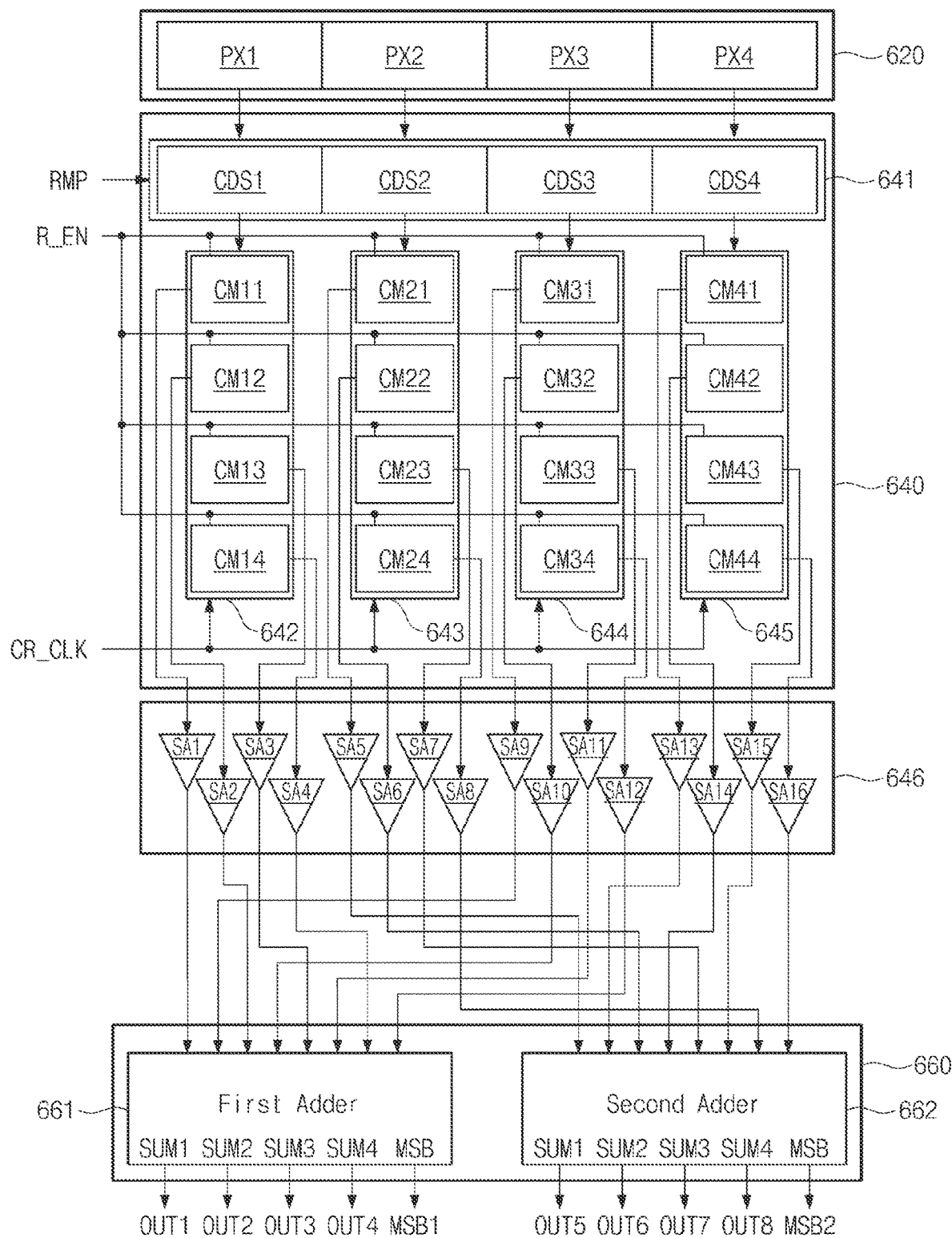
FIG. 8 is a diagram illustrating an exemplary embodiment of an image sensing system of FIG. 1.

FIG. 8 is a diagram illustrating an exemplary embodiment of an image sensing system of FIG. 1. Referring to FIG. 8, an image sensing system 600 includes a pixel array 620, an analog-to-digital converter circuit 640, a sense amplifier unit 646, and an average calculator 660. The pixel array 620, the analog-to-digital converter circuit 640, and the average calculator 660 may correspond to the pixel array 120, the analog-to-digital converter circuit 140, and the average calculator 160 of FIG. 1, respectively. For convenience of description, a row decoder, a timing controller, a data aligner, and an image signal processor are omitted, but may be included in the image sensing system 600.

The pixel array 620 includes first to fourth pixels PX1 to PX4 which generate first to fourth pixel signals. To this end, the analog-to-digital converter circuit 640 may include a correlated double sampling circuit 641 and first to fourth column counters 642 to 645. The correlated double sampling circuit 641 includes first to fourth correlate double samplers CDS1 to CDS4 which compare first to fourth pixel signals and the ramp signal RMP to generate first to fourth comparison signals. The first column counter 642 includes the first to fourth counter memories CM11 to CM14 which generate first pixel data based on the first comparison signal. The second column counter 643 includes first to fourth counter memories CM21 to CM24 which generate second pixel data based on the second comparison signal. The third column counter 644 includes first to fourth counter memories CM31 to CM34 which generate third pixel data based on the third comparison signal. The fourth column counter 645 includes first to fourth counter memories CM41 to CM44 which generate fourth pixel data based on the fourth comparison signal.

The analog-to-digital converter circuit 640 generates the first to fourth pixel data, based on the read enable signal R_EN. As illustrated in FIG. 8, in the case where the read enable signal R_EN is input to all the first to fourth counter memories CM11 to CM14, CM21 to CM24, CM31 to CM34, and CM41 to CM44, all bits of the first to fourth pixel data are output in parallel. However, the inventive concept is not limited thereto. For example, the number of pixel data to be output in parallel and the number of bits of pixel data to be output in parallel are determined according to the number of column counters to which the read enable signal R_EN is input and the number of counter memories.

In an embodiment, the sense amplifier unit 646 senses and amplifies pixel data generated from the analog-to-digital converter circuit 640 and outputs the sensed and amplified pixel data. For example, after the first to fourth pixel data corresponding to the first to fourth pixels PX1 to PX4 are generated, fifth to eighth pixel data corresponding to fifth to eighth pixels (not illustrated) arranged at the same row as the first to fourth pixels PX1 to PX4 may be generated. The sense amplifier unit 646 may amplify and output the first to fourth pixel data and then may amplify and output the fifth to eighth pixel data.

The sense amplifier unit 646 may simultaneously output first to fourth bits included in the first to fourth pixel data. To this end, the sense amplifier unit 646 may include first to sixteenth sense amplifiers SA1 to SA16. The first to fourth sense amplifiers SA1 to SA4 may simultaneously output the first to fourth bits of the first pixel data. The fifth to eighth sense amplifiers SA5 to SA8 may simultaneously output the first to fourth bits of the second pixel data. The ninth to twelfth sense amplifiers SA9 to SA12 may simultaneously output the first to fourth bits of the third pixel data. The thirteenth to sixteenth sense amplifiers SA13 to SA16 may simultaneously output the first to fourth bits of the fourth pixel data. Unlike the illustration of FIG. 8, the image sensing system 600 may omit the sense amplifier unit 646. For example, a plurality of bits of the first pixel data may be output from the first column counter 642 to the average calculator 660 through a plurality of output lines.

In an embodiment, the average calculator 660 includes first and second adders 661 and 662 for simultaneously performing an average operation on output bits, in response to an enable signal. The first adder 661 may perform a sum operation on the first and third pixel data simultaneously for each group of bits. The second adder 662 may perform a sum operation on the second and fourth pixel data simultaneously for each group of bits. The average calculator 660 may generate average data by performing bit shifting on the data summed by the first and second adders 661 and 662.

Figure 9:
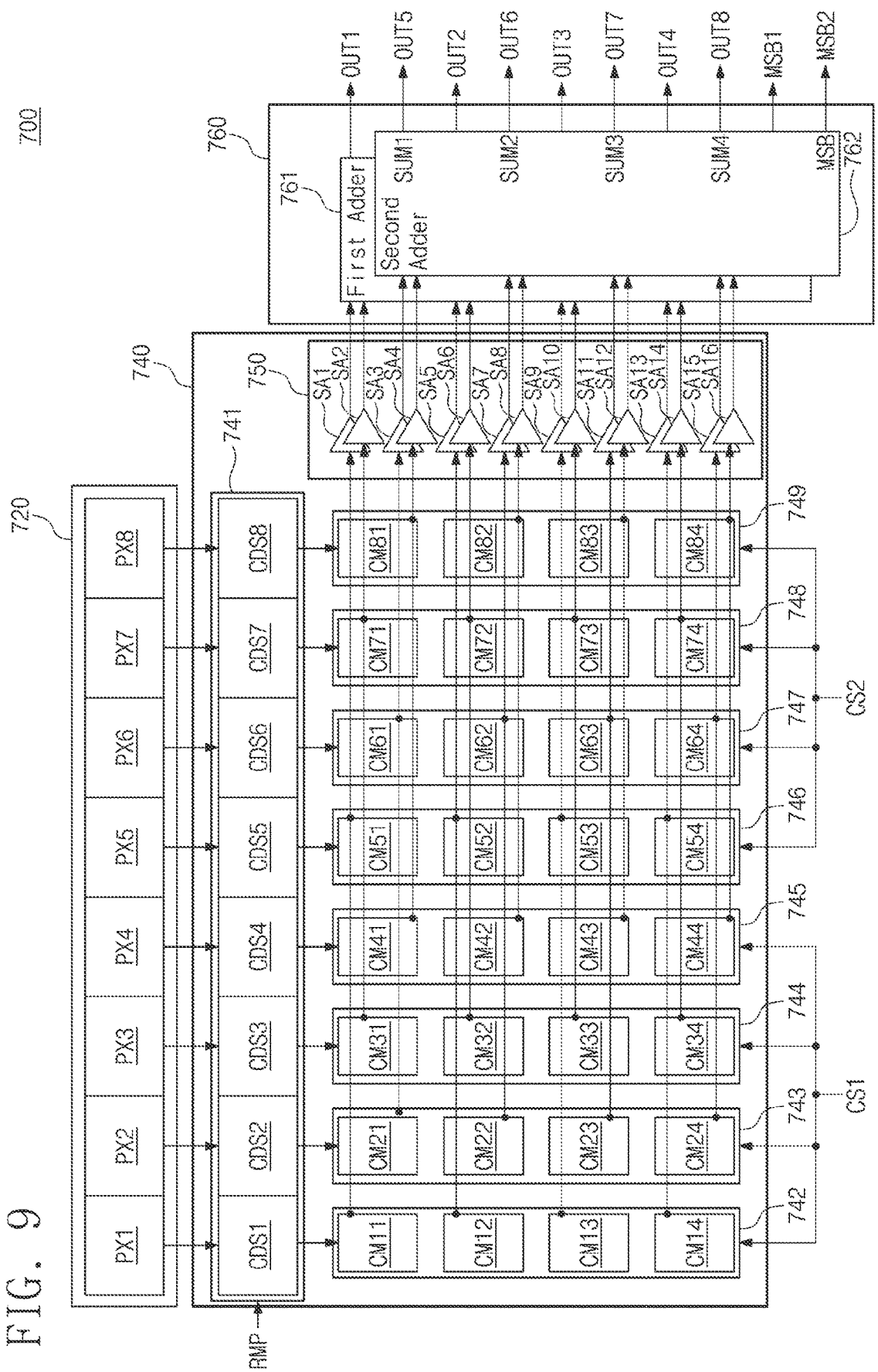
FIG. 9 is a diagram illustrating an exemplary embodiment of an image sensing system of FIG. 1.

FIG. 9 is a diagram illustrating an exemplary embodiment of an image sensing system of FIG. 1. Referring to FIG. 9, an image sensing system 700 includes a pixel array 720, an analog-to-digital converter circuit 740, a sense amplifier unit 750, and an average calculator 760. The pixel array 720, the analog-to-digital converter circuit 740, and the average calculator 760 may correspond to the pixel array 120, the analog-to-digital converter circuit 140, and the average calculator 160 of FIG. 1, respectively. For convenience of description, a row decoder, a timing controller, a data aligner, and an image signal processor are omitted, but may be included in the image sensing system 700.

The pixel array 720 includes first to eighth pixels PX1 to PX8 which generate first to eighth pixel signals. The analog-to-digital converter circuit 740 includes a correlated double sampling circuit 741 and first to eighth column counters 742 to 749. The correlated double sampling circuit 741 includes first to eighth correlate double samplers CDS1 to CDS8 which compare first to eighth pixel signals and the ramp signal RMP to generate first to eighth comparison signals. As in the above description, the first to eighth column counters 742 to 749 include first to eighth counter memories CM11 to CM14, CM21 to CM24, CM31 to CM34, CM41 to CM44, CM51 to CM54, CM61 to CM64, CM71 to CM74, and CM81 to CM84 which generate first to eighth pixel data based on the first to eighth comparison signals.

During a first time, the analog-to-digital converter circuit 740 generates the first to fourth pixel data, based on a first column selection signal CS1. Afterwards, during a second time, the analog-to-digital converter circuit 740 generates the fifth to eighth pixel data, based on a second column selection signal CS2. The number of pixel data to be output in parallel is determined according to the number of column counters to which a column selection signal (e.g., CS1 or CS2) is input. For example, the analog-to-digital converter circuit 740 may output all bits of pixel data in parallel, based on the column selection signals CS1 and CS2, without receiving a separate read enable signal.

In an embodiment, the sense amplifier unit 750 senses and amplifies pixel data generated from the analog-to-digital converter circuit 740 and outputs the sensed and amplified pixel data. The sense amplifier unit 750 may sense and amplify the first to fourth pixel data, based on the first column selection signal CS1. Afterwards, the sense amplifier unit 750 may sense and amplify the fifth to eighth pixel data, based on the second column selection signal CS2.

The sense amplifier unit 750 includes the first to sixteenth sense amplifiers SA1 to SA16. First, the first, fifth, ninth, and thirteenth sense amplifiers SA1, SA5, SA9, and SA13 respectively amplify and output first to fourth bits of the first pixel data. At the same time, the second, sixth, tenth, and fourteenth sense amplifiers SA2, SA6, SA10, and SA14 respectively amplify and output first to fourth bits of the second pixel data. At the same time, the third, seventh, eleventh, and fifteenth sense amplifiers SA3, SA7, SA11, and SA15 respectively amplify and output first to fourth bits of the third pixel data. At the same time, the fourth, eighth, twelfth, and sixteenth sense amplifiers SA4, SA8, SA12, and SA16 respectively amplify and output first to fourth bits of the fourth pixel data. Afterwards, in the same manner, the first to sixteenth sense amplifiers SA1 to SA16 respectively amplify and output first to fourth bits of each of the fifth to eighth pixel data.

Unlike the above image sensing systems, the sense amplifier unit 750 may be positioned adjacent to the analog-to-digital converter circuit 740 in a row direction to make parallel processing of bits of pixel data easy. The sense amplifier unit 750 may process pixel data corresponding to columns selected by a column selection signal in parallel. The sense amplifier unit 750 may sequentially select the remaining columns to process the remaining pixel data, thereby making it possible to process pixel data corresponding to a plurality of columns when sense amplifiers are limited in number.

The average calculator 760 includes first and second adders 761 and 762 for simultaneously performing an average operation on output bits, in response to an enable signal. The first adder 761 may perform a sum operation on the first and third pixel data simultaneously for each group of bits, and then may perform a sum operation on the fifth and seventh pixel data simultaneously for each group of bits. The second adder 762 may perform a sum operation on the second and fourth pixel data simultaneously for each group of bits, and then may perform a sum operation on the sixth and eighth pixel data simultaneously for each group of bits. The average calculator 760 may generate average data by performing bit shifting on the summed data.

Figure 10:
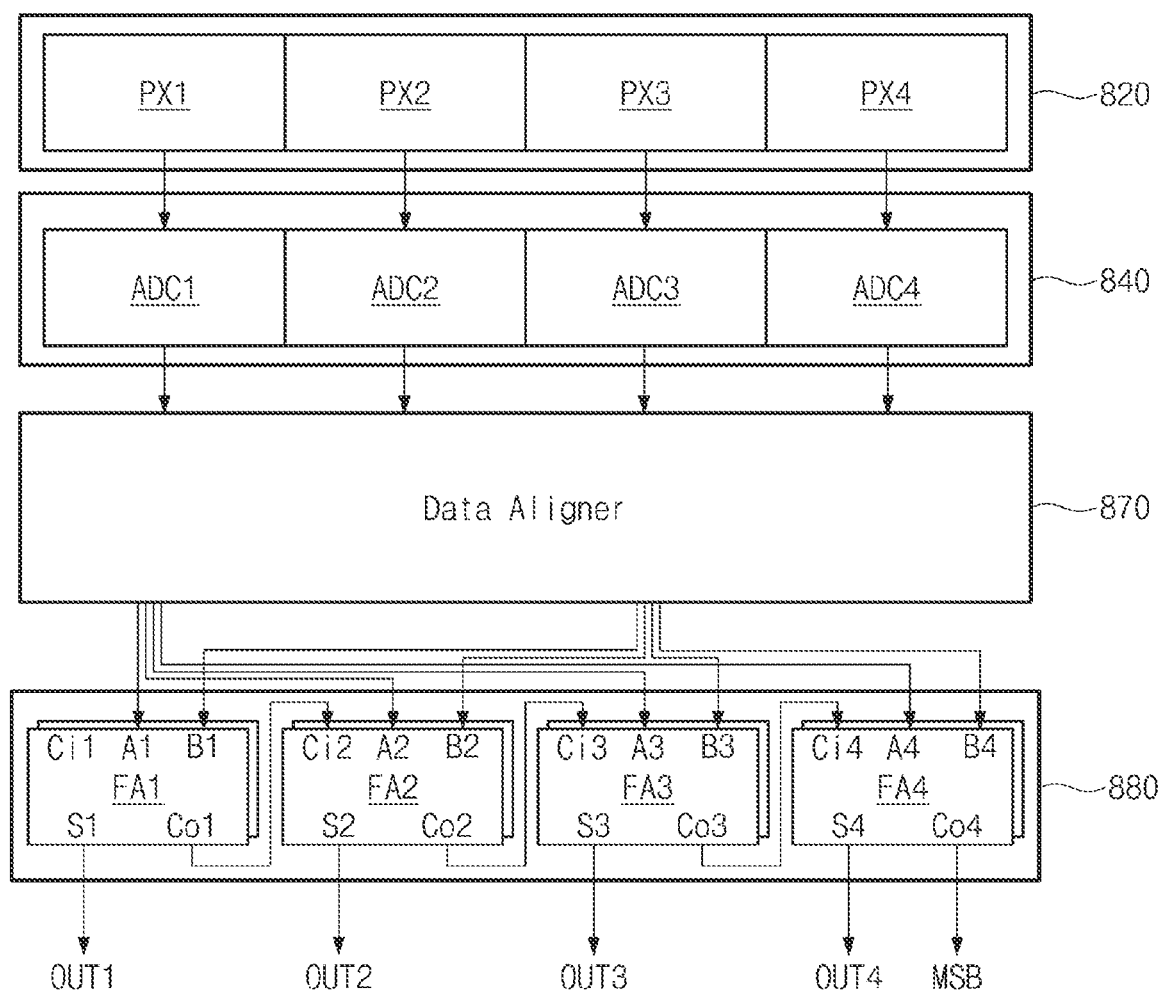
FIG. 10 is a diagram illustrating an embodiment in which an average operation of pixel data is performed by an image signal processor.

FIG. 10 is a diagram illustrating an embodiment in which an average operation of pixel data is performed by an image signal processor. Referring to FIG. 10, an image sensing system 800 includes a pixel array 820, an analog-to-digital converter circuit 840, a data aligner 870, and an image signal processor 880. The image sensing system 800 does not include a separate average calculator.

Like FIG. 2, the pixel array 820 includes the first to fourth pixels PX1 to PX4 which generate the first to fourth pixel signals. The analog-to-digital converter circuit 840 includes first to fourth analog-to-digital converters ADC1 to ADC4. The first to fourth analog-to-digital converters ADC1 to ADC4 may convert the first to fourth pixel signals to first to fourth pixel data, respectively. The first to fourth pixel data may be output to the data aligner 870 sequentially for each bit.

The data aligner 870 may align the first to fourth pixel data. The data aligner 870 may be configured such that bits included in each of the first to fourth pixel data are simultaneously output. In the case where one pixel data includes first to fourth bits, the first to fourth bits may be simultaneously provided to the image signal processor 880. The alignment may be performed when functions for image processing of the image signal processor 880 require normally aligned pixel data.

To improve a speed at which an image is processed, the image signal processor 880 may perform an average operation on the first and third pixel data and may perform an average operation on the second and fourth pixel data. To this end, the image signal processor 880 may include first to fourth full adders FA1 to FA4. The number of full adders may depend on the number of bits included in pixel data.

The first full adder FA1 generates a first sum bit and a first carry bit by performing a sum operation on the first bits of the first and third pixel data. The second full adder FA2 generates a second sum bit and a second carry bit by performing a sum operation on the second bits of the first and third pixel data and the first carry bit. The second sum bit may be a least significant bit of average data, that is, a first bit by bit shifting. The third full adder FA3 generates a third sum bit and a third carry bit by performing a sum operation on the third bits of the first and third pixel data and the second carry bit. The third sum bit may be a second bit of the average data. The fourth full adder FA4 generates a fourth sum bit and a fourth carry bit by performing a sum operation on the fourth bits of the first and third pixel data and the third carry bit. The fourth sum bit may be a third bit of the average data, and the fourth carry bit may be a fourth bit of the average data.

Referring to FIG. 10, a function of merging pixel data is implemented in the image signal processor 880 instead of an average calculator. In this case, pixel data output from the analog-to-digital converter circuit 840 are transferred directly to the image signal processor 880 through the data aligner 870. Accordingly, the amount of data to be transferred may increase compared to the above embodiments, and the amount of data which the data aligner 870 processes may increase. Also, in the case where the number of pixels increases to improve the image quality, the number of channels for transferring pixel data may increase. In this case, the size of a chip in which the image sensing system 800 is implemented may increase, and power consumption may increase.

Unlike FIG. 10, the way to merge pixel signals output from the pixel array 820 instead of the image signal processor 880 may be considered. However, in the case of merging the first and third pixel signals, if a difference between the first pixel signal and the third pixel signal is too great, a winner-takes-all strategy is employed where the magnitude of a merged pixel signal is focused toward the first pixel signal. In this case, the accuracy of the merged pixel signal may decrease. Also, in the case of merging pixel signals, a time taken to output pixel signals from the pixel array 820 may increase, and power consumption may increase. Also, like the Bayer pattern, since pixels of the same color are not positioned adjacent to each other, when performing merging of the first and third pixel signals, the second pixel signal may be distorted due to crosstalk. Also, in the case of merging the first and third pixel signals, since only one of the first and third analog-to-digital converters ADC1 and ADC3 is used, it may be difficult to remove a noise by the analog-to-digital converter circuit 740.

Figure 11:
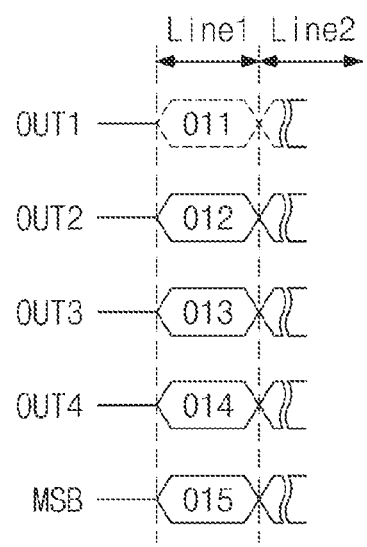
FIG. 11 is a timing diagram for describing data which are output upon merging pixel data by an image signal processor of FIG. 10.

FIG. 11 is a timing diagram for describing data which is output upon merging pixel data by an image signal processor of FIG. 10. Output data OUT1, OUT2, OUT3, OUT4, and MSB which are output as results of sum operations of the first to fourth full adders FA1 to FA4 are illustrated in FIG. 11. FIG. 11 will be described with reference to reference numerals/marks of FIG. 10.

As described with reference to FIG. 10, the image signal processor 880 may receive the first to fourth bits of the first to fourth pixel data in parallel. As such, the number of full adders required to merge pixel data may increase. A first sum bit is generated according to a sum operation of the first full adder FA1. In the case where bit shifting is performed, the first sum bit is not included in average data. In the case of considering a decimal point, the first sum bit may be the first bit O11 of the average data.

A second sum bit is generated according to a sum operation of the second full adder FA2. In the case where bit shifting is performed, the second sum bit may be a first bit O12 of the average data. In this case, the second sum bit may be a least significant bit. A third sum bit may be generated according to a sum operation of the third full adder FA3, and the third sum bit may be a second bit O13 of the average data. A fourth sum bit and a fourth carry bit may be generated according to a sum operation of the fourth full adder FA4, and the fourth sum bit may be a third bit O14 of the average data. The fourth carry bit may be a fourth bit O15 of the average data. The fourth carry bit may be a most significant bit of the average data. As illustrated in FIG. 11, the bits O11 to O15 of the average data may be output in parallel by the operations of the first to fourth full adders FA1 to FA4.

Figure 12:
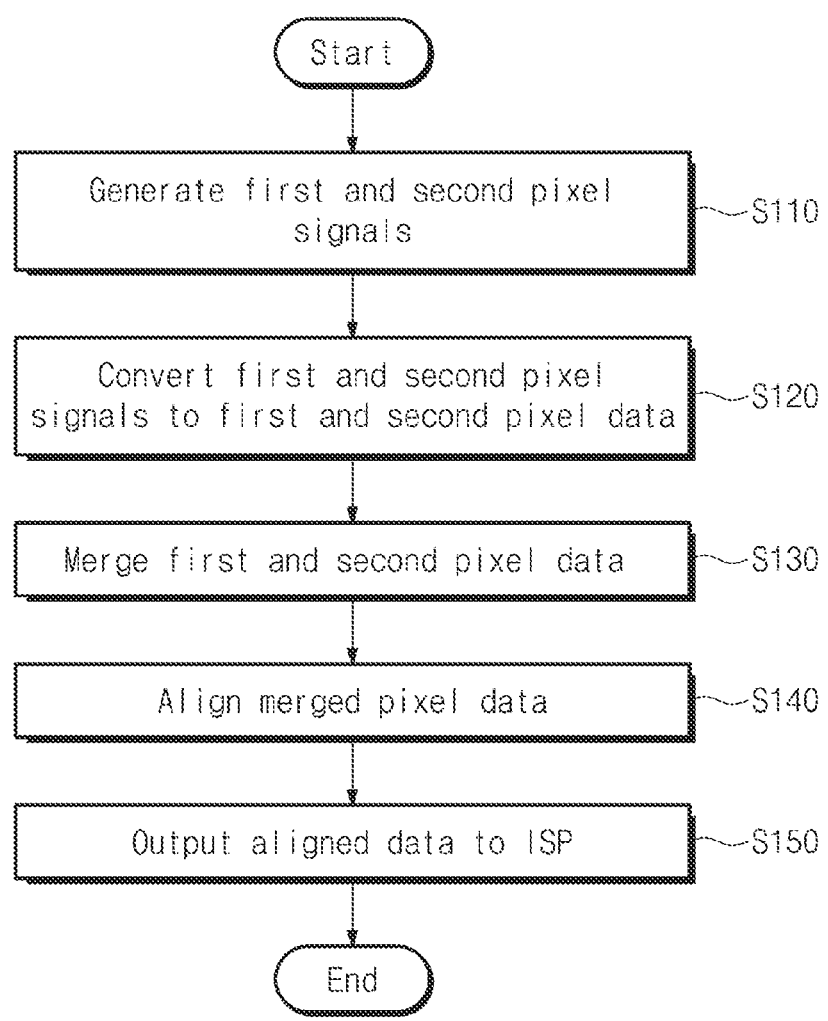
FIG. 12 is a flowchart illustrating an operating method of an image sensing system according to an exemplary embodiment of the inventive concept.

FIG. 12 is a flowchart illustrating an operating method of an image sensing system according to an exemplary embodiment of the inventive concept. Referring to FIG. 12, an operating method of an image sensing system may be performed by one of the image sensing systems 100 to 700 described with reference to FIGS. 1 to 9. For convenience of description, the flowchart of FIG. 12 will be described with reference to reference numerals/marks of FIG. 1 or 2.

In operation S110, the pixel array 220 generates first and second pixel signals. In the case of the image sensing system 200 illustrated in FIG. 2, it may be understood that the first pixel signal is generated by the first pixel PX1 and the second pixel signal is generated by the third pixel PX3. The first pixel PX1 and the third pixel PX3 are pixels of the same color.

In operation S120, the analog-to-digital converter circuit 240 converts the first and second pixel signals to first and second pixel data. For example, the first correlated double sampler CDS1 may generate the first comparison signal based on a result of comparing the first pixel signal and the ramp signal RMP, and the first column counter 242 may generate the first pixel data by counting a time when the first comparison signal is at a high level. The third correlated double sampler CDS3 may generate the second comparison signal based on a result of comparing the second pixel signal and the ramp signal RMP, and the third column counter 244 may generate the second pixel data by counting a time when the second comparison signal is at a high level.

In operation S130, the average calculator 260 merges the first and second pixel data. The average calculator 260 may generate average data by performing an average operation on the first and second pixel data. For example, the average calculator 260 may perform a sum operation on the first and second pixel data by using the first full adder FA1 and the first flip-flop FF1, and may perform bit shifting.

In operation S140, the data aligner 170 aligns the merged pixel data, that is, the average data. The average data may be output to the data aligner 170 sequentially for each bit. The data aligner 170 may align the average data such that bits included in the average data are output in parallel.

In operation S150, the aligned average data is output to the image signal processor 180. The amount of data transferred to the data aligner 170 and the image signal processor 180 may decrease through operation S130. Accordingly, a speed at which the image signal processor 180 processes an image may be improved, and the establishment of additional channels for a data transfer or the alignment burden of data may decrease.

Figure 13:
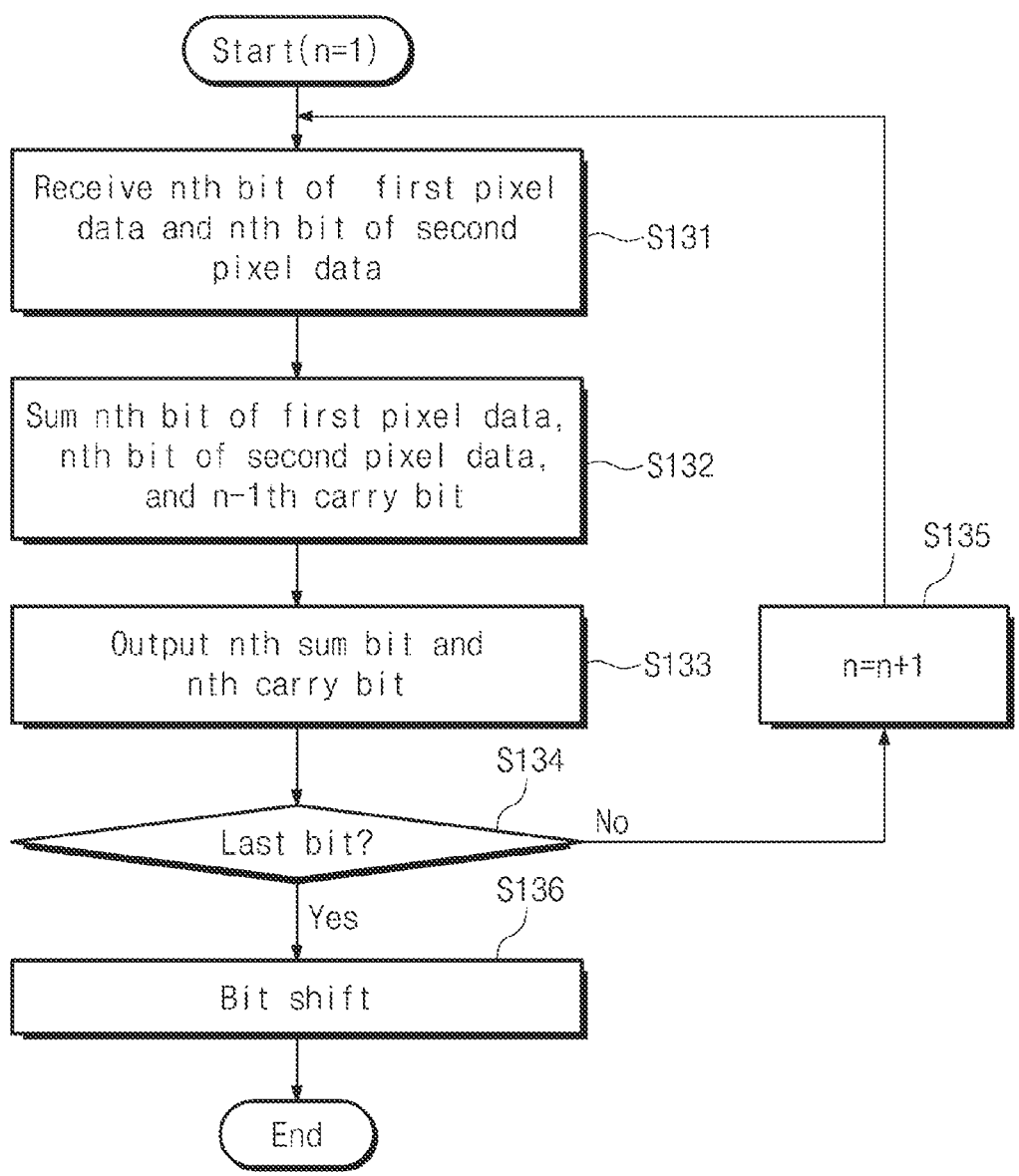
FIG. 13 is a flowchart illustrating operation S130 of FIG. 12 according to an exemplary embodiment of the inventive concept.

FIG. 13 illustrates a method of implementing operation S130 of FIG. 12 according to an exemplary embodiment of the inventive concept. An operation of merging first pixel data and second pixel data by using an average calculator will be more fully described with reference to FIG. 13. Operations of FIG. 13 may be performed by one of the average calculators 160 to 760 described with reference to FIGS. 1 to 9. For convenience of description, the flowchart of FIG. 13 will be described with reference to reference numerals/marks of FIG. 2.

In operation S131, the average calculator 260 receives an n-th bit of the first pixel data and an n-th bit of the second pixel data. Here, "n" may be a natural number. The analog-to-digital converter circuit 240 may sequentially output pixel data for each bit, based on the first to fourth read enable signals R_EN1 to R_EN4 which have a high level sequentially. As a result, the first full adder FA1 receives pixel data for each bit.

In operation S132, the average calculator 260 performs a sum operation on the n-th bit of the first pixel data, the n-th bit of the second pixel data, and a (n−1)-th carry bit. The first full adder FA1 included in the average calculator 260 may perform the above sum operation. In the case where "n" is 1, since the (n−1)-th carry bit does not exist, the first full adder FA1 performs the sum operation on a first bit of the first pixel data and a first bit of the second pixel data. The first flip-flop FF1 may store the (n−1)-th carry bit and may provide the (n−1)-th carry bit to the first full adder FA1 upon performing a sum operation. As a result of the sum operation, the first full adder FA1 may generate an n-th sum bit and an n-th carry bit.

In operation S133, the average calculator 260 outputs the n-th sum bit and the n-th carry bit. The n-th sum bit may be output to the first multiplexer MUX1, and the n-th carry bit may be output to the first flip-flop FF1. However, in the case where the n-th bit is the last bit, the n-th bit may be output to an image signal processor as a most significant bit of average data.

In operation S134, the average calculator 260 determines whether the n-th bits of the first and second pixel data received are the last bit. In the case where all bits of the first and second pixel data are input to the first and second input terminals A1 and B1 of the first full adder FA1, operation S136 is performed. In the case where next bits of the first and second pixel data are input to the first and second input terminals A1 and B1 of the first full adder FA1, operation S135 is performed.

In operation S135, the average calculator 260 receives a (n+1)-th bit of the first pixel data and a (n+1)-th bit of the second pixel data. Operation S131 to operation S135 are repeated until the n-th bits of the first and second pixel data received are the last bit.

In operation S136, the average data may be output to a data aligner and an image signal processor after bit shifting. Through operation S131 to operation S135, the first to n-th sum bits and the n-th carry bit may be output from the average calculator 260. In this case, for the average operation, the first sum bit is not output, and bit shifting is performed on the first sum bit. However, the inventive concept is not limited thereto. For example, the first sum bit may be output to the image signal processor when considering a decimal point for an exact operation of the image signal processor later.

An image sensing system and an operating method thereof, according to an embodiment of the inventive concept, may perform an average operation on pixel data converted from an analog to digital converter circuit and may provide a result of the average operation to an image signal processor, thereby reducing the amount of data, and an amount of time processing an image. Further, noise may be reduced due to the analog to digital converter circuit.

While the inventive concept has been described with reference to exemplary embodiments thereof, it will be apparent to those of ordinary skill in the art that various changes and modifications may be made thereto without departing from the spirit and scope of the inventive concept.

What is claimed is:

1. An image sensing system comprising:
    a pixel array including a first pixel, a second pixel, a third pixel, and a fourth pixel arranged in a same row, wherein the first and third pixels have a first color, the second and fourth pixels have a second color different from the first color, and the first to fourth pixels are configured to generate a first to fourth pixel signals, respectively;
    an analog-to-digital converter (ADC) circuit including a first ADC, a second ADC, a third ADC, and a fourth ADC, wherein the first to fourth ADCs are configured to generate first to fourth pixel data based on the first to fourth pixel signals, respectively, each of the first to fourth pixel data sequentially includes first to N-th bits, and N is natural number; and
    an average calculator including a first adder and a second adder, wherein the first adder is configured to generate a first average data by a first sum operation summing the first to N-th bits of the first pixel data and the first to N-th bits of the third pixel data, respectively, and the second adder is configured to generate a second average data by a second sum operation summing the first to N-th bits of the second pixel data and the first to N-th bits of the fourth pixel data, respectively,
    wherein the average calculator is configured to output first to N-th average bits of the first average data and first to N-th average bits of the second average data, in parallel.

2. The image sensing system of claim 1, wherein the average calculator is further configured to output the first average bit of the first average data and the first average bit of the second average data, in parallel, and then output the second average bit of the first average data and the second average bit of the second average data, in parallel.

3. The image sensing system of claim 1, wherein the first adder is further configured to:
    generate a first sum bit and a first carry bit by summing the first bit of the first pixel data and the first bit of the third pixel data, during a first time; and
    generate a second sum bit and a second carry bit by summing the second bit of the first pixel data, the second bit of the third pixel data, and the first carry bit, during a second time following the first time, and
    wherein the second adder is further configured to:
    generate a third sum bit and a third carry bit by summing the first bit of the second pixel data and the first bit of the fourth pixel data, during the first time; and
    generate a fourth sum bit and a fourth carry bit by summing the second bit of the second pixel data, the second bit of the fourth pixel data, and the third carry bit, during the second time.

4. The image sensing system of claim 3,
    wherein the first adder is further configured to output the second sum bit as the first average bit of the first average data, when the first bit of the first pixel data is a least significant bit (LSB) of the first pixel data, and the first bit of the third pixel data is a LSB of the third pixel data,
    wherein the second adder is further configured to output the fourth sum bit as the first average bit of the second average data, when the first bit of the second pixel data is a LSB of the second pixel data, and the first bit of the fourth pixel data is a LSB of the fourth pixel data, and
    wherein the first average bit of the first average data is a LSB of the first average data, and the first average bit of the second average data is a LSB of the second average data.

5. The image sensing system of claim 3, wherein the average calculator further includes:
    a first flip-flop, during the first time, configured to receive the first carry bit from the first adder, and then to output the first carry bit to the first adder; and a second flip-flop, during the first time, configured to receive the third carry bit from the second adder, and then to output the third carry bit to the second adder.

6. The image sensing system of claim 1, wherein the average calculator further includes:
   a first multiplexer configured to receive the first pixel data from the first ADC and the first average data from the first adder, and to output the first pixel data in a first operating mode and the first average data in a second operating mode;
   a second multiplexer configured to receive the second pixel data from the second ADC, to output the second pixel data in the first operating mode, and not to output data in the second operating mode;
   a third multiplexer configured to receive the third pixel data from the third ADC and the second average data from the second adder, to output the third pixel data in the first operating mode and the second average data in the second operating mode; and
   a fourth multiplexer configured to receive the fourth pixel data from the fourth ADC, to output the fourth pixel data in the first operating mode based, and not to output data in the second operating mode.

7. The image sensing system of claim 1, wherein the average calculator is further configured to:
   output the first to fourth pixel data in a first operating mode based on a first state of an enable signal; and
   output the first average data and the second average data in a second operating mode based on a second state different from the first state of the enable signal.

8. The image sensing system of claim 7, wherein the first operating mode corresponds to an original operation and the second operating mode corresponds to a preview operation.

9. The image sensing system of claim 1, further comprising:
   a data aligner configured to receive the first average bit of the first average data during a first time, receive the second average bit of the first average data during a second time following the first time, and output an aligned average data based on the first and second average bit of the first average data; and
   an image signal processor configured to perform an image processing based on the aligned average data.

10. An image sensing system comprising:
    a pixel array including a first pixel group, a second pixel group, a third pixel group, and a fourth pixel group arranged in a first direction, wherein each of the first to fourth pixel group includes four pixels adjacent to each other in the first direction and a second direction perpendicular to the first direction, the first pixel group have a first color and is configured to generate a first pixel signal in which four pixel signals of four pixels of the first pixel group are summed, the second pixel group have a second color different from the first color and is configured to generate a second pixel signal in which four pixel signals of four pixels of the second pixel group are summed, the third pixel group have the first color and is configured to generate a third pixel signal in which four pixel signals of four pixels of the third pixel group are summed, and the fourth pixel group have the second color and is configured to generate a fourth pixel signal in which four pixel signals of four pixels of the fourth pixel group are summed;
    an analog-to-digital converter (ADC) circuit including a first ADC, a second ADC, a third ADC, and a fourth ADC, wherein the first to fourth ADCs are configured to generate first to fourth pixel data based on the first to fourth pixel signals, respectively, each of the first to fourth pixel data sequentially includes first to N-th bits, and N is natural number; and
    an average calculator including a first adder and a second adder, wherein the first adder is configured to generate a first average data by a first sum operation summing the first to N-th bits of the first pixel data and the first to N-th bits of the third pixel data, respectively, and the second adder is configured to generate a second average data by a second sum operation summing the first to N-th bits of the second pixel data and the first to N-th bits of the fourth pixel data, respectively,
    wherein the average calculator is configured to output first to N-th average bits of the first average data and first to N-th average bits of the second average data, in parallel.

11. The image sensing system of claim 10, wherein the average calculator is further configured to output the first average bit of the first average data and the first average bit of the second average data, in parallel, and then output the second average bit of the first average data and the second average bit of the second average data, in parallel.

12. The image sensing system of claim 10, wherein the first adder is further configured to:
    generate a first sum bit and a first carry bit by summing the first bit of the first pixel data and the first bit of the third pixel data, during a first time; and
    generate a second sum bit and a second carry bit by summing the second bit of the first pixel data, the second bit of the third pixel data, and the first carry bit, during a second time following the first time, and
    wherein the second adder is further configured to:
    generate a third sum bit and a third carry bit by summing the first bit of the second pixel data and the first bit of the fourth pixel data, during the first time; and
    generate a fourth sum bit and a fourth carry bit by summing the second bit of the second pixel data, the second bit of the fourth pixel data, and the third carry bit, during the second time.

13. The image sensing system of claim 12, wherein the first adder is further configured to output the second sum bit as the first average bit of the first average data, when the first bit of the first pixel data is a least significant bit (LSB) of the first pixel data, and the first bit of the third pixel data is a LSB of the third pixel data,
    wherein the second adder is further configured to output the fourth sum bit as the first average bit of the second average data, when the first bit of the second pixel data is a LSB of the second pixel data, and the first bit of the fourth pixel data is a LSB of the fourth pixel data, and
    wherein the first average bit of the first average data is a LSB of the first average data, and the first average bit of the second average data is a LSB of the second average data.

14. The image sensing system of claim 12, wherein the average calculator further includes:
    a first flip-flop, during the first time, configured to receive the first carry bit from the first adder, and then to output the first carry bit to the first adder; and
    a second flip-flop, during the first time, configured to receive the third carry bit from the second adder, and then to output the third carry bit to the second adder.

15. The image sensing system of claim 10, wherein the average calculator further includes:
    a first multiplexer configured to receive the first pixel data from the first ADC and the first average data from the first adder, and to output the first pixel data in a first operating mode and the first average data in a second operating mode;

a second multiplexer configured to receive the second pixel data from the second ADC, to output the second pixel data in the first operating mode, and not to output data in the second operating mode;

a third multiplexer configured to receive the third pixel data from the third ADC and the second average data from the second adder, to output the third pixel data in the first operating mode and the second average data in the second operating mode; and a fourth multiplexer configured to receive the fourth pixel data from the fourth ADC, to output the fourth pixel data in the first operating mode based, and not to output data in the second operating mode.

16. The image sensing system of claim 10, the average calculator is further configured to:

output the first to fourth pixel data in a first operating mode based on a first state of an enable signal; and output the first average data and the second average data in a second operating mode based on a second state different from the first state of the enable signal.

17. An image sensing system comprising:

a pixel array including a first pixel, a second pixel, a third pixel, a fourth pixel, pixel, and a sixth pixel arranged in a same row, wherein the first pixel, the third pixel, and the fifth pixel have a first color, the second pixel, the fourth pixel, and the sixth pixel have a second color different from the first color, the first to sixth pixels are configured to generate a first to sixth pixel signals, respectively;

an analog-to-digital converter (ADC) circuit including a first ADC, a second ADC, a third ADC, a fourth ADC, a fifth ADC, and a sixth ADC wherein the first to sixth ADCs are configured to generate first to sixth pixel data based on the first to sixth pixel signals, respectively, each of the first to sixth pixel data sequentially includes first to N-th bits, and N is natural number; and an average calculator including a first adder and a second adder, wherein the first adder is configured to generate a first average data by summing the first to N-th bits of the first pixel data, the first to N-th bits of the third pixel data, and the first to N-th bits of the fifth pixel data, respectively, and the second adder is configured to generate a second average data by summing the first to N-th bits of the second pixel data, the first to N-th bits of the fourth pixel data, and the first to N-th bits of the sixth pixel data, respectively, and wherein the average calculator is configured to output first to N-th average bits of the first average data and first to N-th average bits of the second average data, in parallel.

18. The image sensing system of claim 17, wherein the pixel array further includes a seventh pixel and an eighth pixel arranged in the same row, the seventh pixel has the first color and is configured to generate a seventh pixel signal, and the eighth pixel has the second color and is configured to generate an eighth pixel signal, wherein the ADC circuit further includes a seventh ADC and a eighth ADC, the seventh and eighth ADCs are configured to generate seventh and eighth pixel data based on the seventh and eighth pixel signals, respectively, and each of the seventh and eighth pixel data sequentially includes first to N-th bits, wherein the first adder is further configured to generate the first average data by summing the first to N-th bits of the first pixel data, the first to N-th bits of the third pixel data, the first to N-th bits of the fifth pixel data, and the first to N-th bits of the seventh pixel data, respectively, and wherein the second adder is further configured to generate the second average data by summing the first to N-th bits of the second pixel data, the first to N-th bits of the fourth pixel data, the first to N-th bits of the sixth pixel data, and the first to N-th bits of the eighth pixel data, respectively.

19. The image sensing system of claim 18, wherein the first pixel, the second pixel, the third pixel, the fourth pixel, the fifth pixel, the sixth pixel, the seventh pixel, and the eighth pixel are sequentially arranged in the same row.

* * * * *